(12) United States Patent
    Toba et al.

(10) Patent No.: US 12,114,437 B2
(45) Date of Patent: Oct. 8, 2024

(54) WIRING STRUCTURE, METHOD FOR MANUFACTURING SAME, AND SEMICONDUCTOR PACKAGE

(71) Applicant: Showa Denko Materials Co., Ltd., Tokyo (JP)

(72) Inventors: Masaya Toba, Tokyo (JP); Kazuyuki Mitsukura, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 191 days.

(21) Appl. No.: 17/926,710

(22) PCT Filed: Jun. 23, 2021

(86) PCT No.: PCT/JP2021/023799
    § 371 (c)(1),
    (2) Date: Nov. 21, 2022

(87) PCT Pub. No.: WO2021/261525
    PCT Pub. Date: Dec. 30, 2021

(65) Prior Publication Data
    US 2023/0209725 A1    Jun. 29, 2023

(30) Foreign Application Priority Data
    Jun. 24, 2020  (JP) ................................ 2020-108669
    Jun. 24, 2020  (JP) ................................ 2020-108697

(51) Int. Cl.
    *H05K 3/38*     (2006.01)
    *H01L 21/48*    (2006.01)
    (Continued)

(52) U.S. Cl.
    CPC ........... *H05K 3/381* (2013.01); *H01L 21/486* (2013.01); *H01L 23/49838* (2013.01);
    (Continued)

(58) Field of Classification Search
    CPC ......... H05K 3/38; H05K 3/381; H05K 3/4644
    See application file for complete search history.

(56) References Cited

U.S. PATENT DOCUMENTS

| 9,288,903 B2* | 3/2016 | Hasegawa ............ H05K 1/0393 |
| 2006/0084253 A1* | 4/2006 | Mizukoshi ........ H01L 21/76801 |
| | | 257/E23.152 |

(Continued)

FOREIGN PATENT DOCUMENTS

| JP | 2003-318519 A | 11/2003 |
| JP | 2004-111807 A | 4/2004 |

(Continued)

Primary Examiner — Sherman Ng
(74) Attorney, Agent, or Firm — FITCH, EVEN, TABIN & FLANNERY, LLP

(57) ABSTRACT

Disclosed is a method for manufacturing a wiring structure including a step of forming a wiring on an insulating resin layer. The step of forming the wiring includes: forming a modified region including pores in a surface layer of the insulating resin layer by treating a surface of the insulating resin layer with a treatment method including surface modification; forming a seed layer on the surface of the insulating resin layer by sputtering; and forming the wiring on the seed layer by electrolytic copper plating.

9 Claims, 10 Drawing Sheets

(51) Int. Cl.
*H01L 23/498* (2006.01)
*H05K 1/09* (2006.01)
*H05K 3/18* (2006.01)
*H05K 3/46* (2006.01)

(52) U.S. Cl.
CPC .............. *H05K 1/09* (2013.01); *H05K 3/18* (2013.01); *H05K 3/4644* (2013.01); *H05K 2201/032* (2013.01); *H05K 2203/0723* (2013.01)

(56) References Cited

U.S. PATENT DOCUMENTS

2016/0329242 A1* 11/2016 Oszinda ............ H01L 21/76831
2019/0363010 A1* 11/2019 Brown ................ C03C 17/3607

FOREIGN PATENT DOCUMENTS

| | | |
|---|---|---|
| JP | 2014-170796 A | 9/2014 |
| JP | 2017-028316 A | 2/2017 |
| JP | 2019-212653 A | 12/2019 |
| WO | 2009/110364 A1 | 9/2009 |

* cited by examiner

Fig.1
(a)
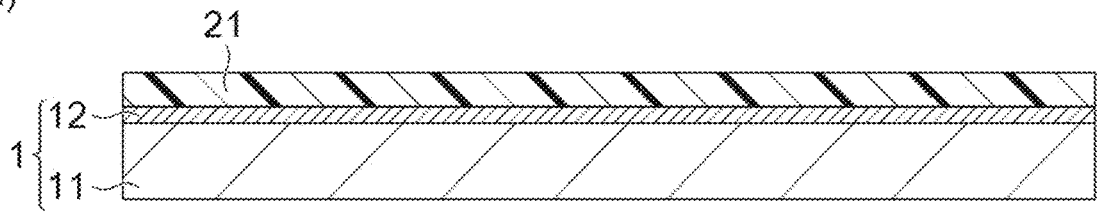
(b)
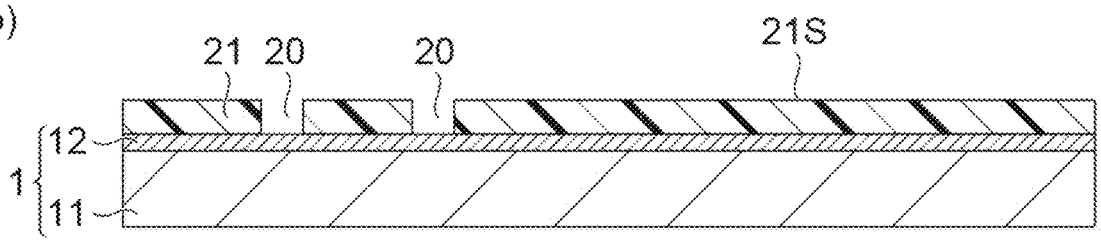
(c)
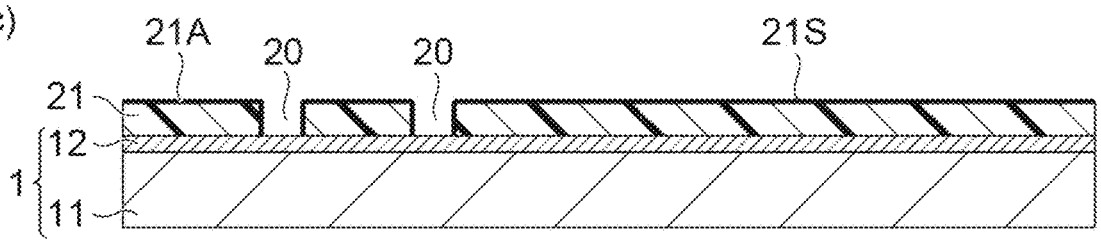
(d)
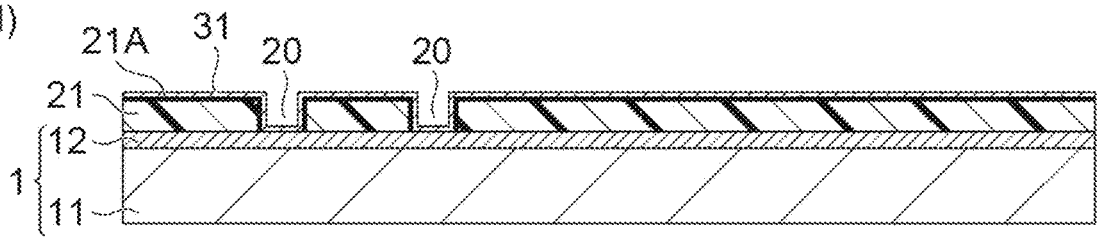
(e)
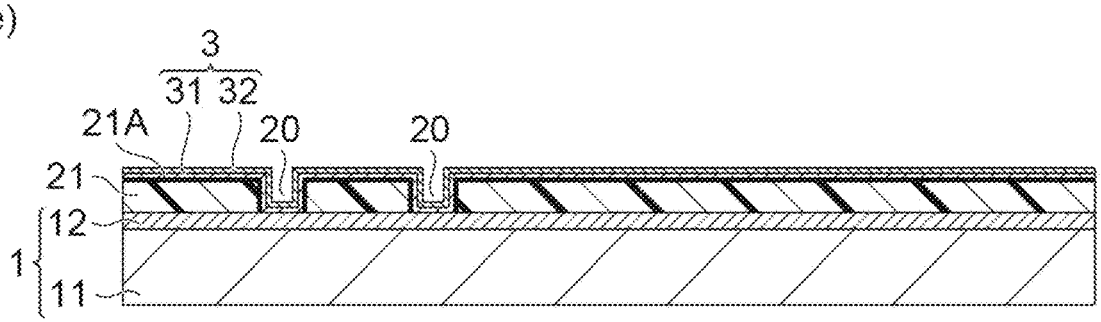

Fig.2
(a)
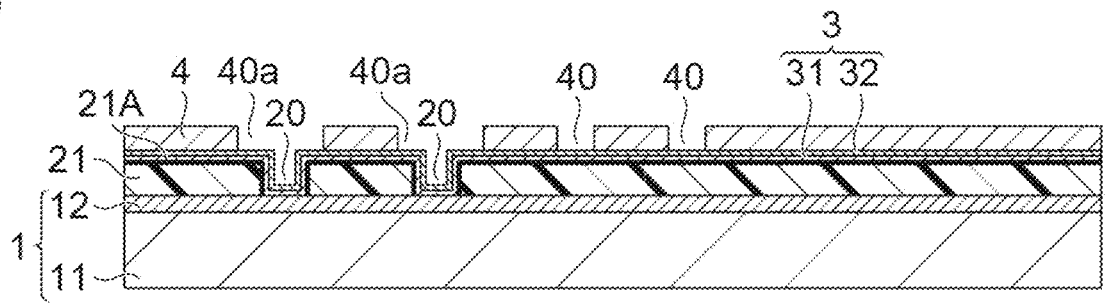
(b)
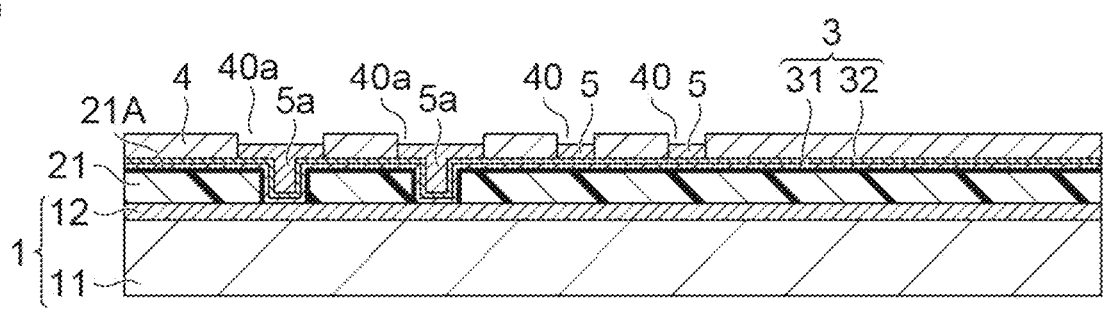
(c)
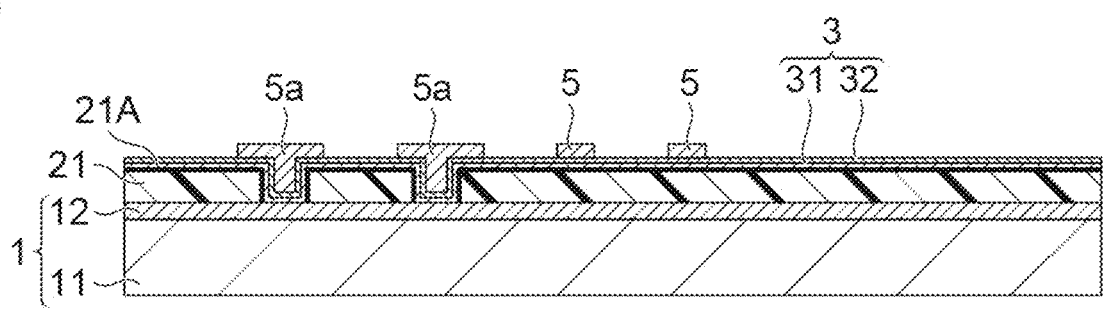
(d)
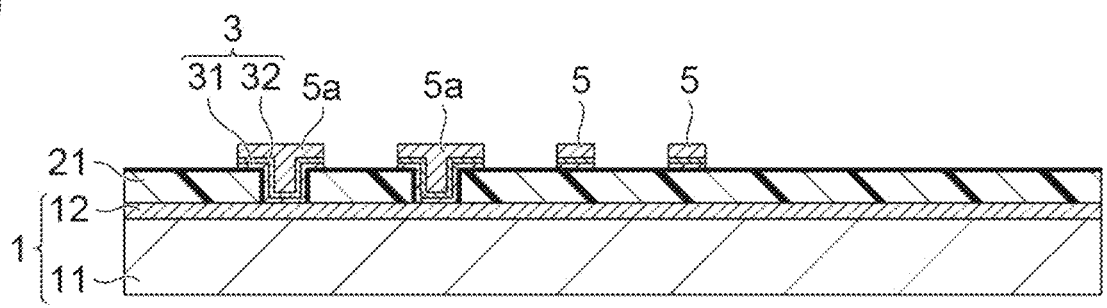

*Fig.3*
(a)
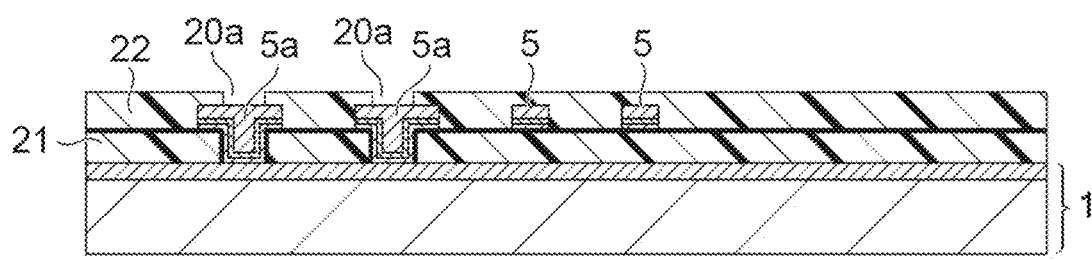
(b)
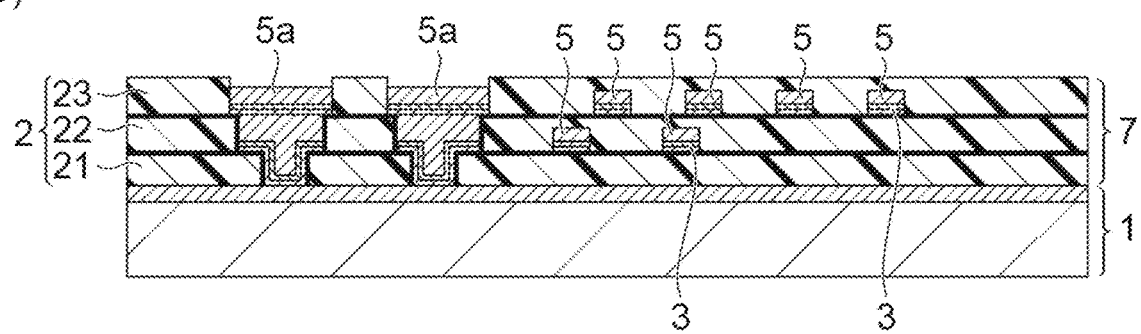

*Fig.4*
(a)
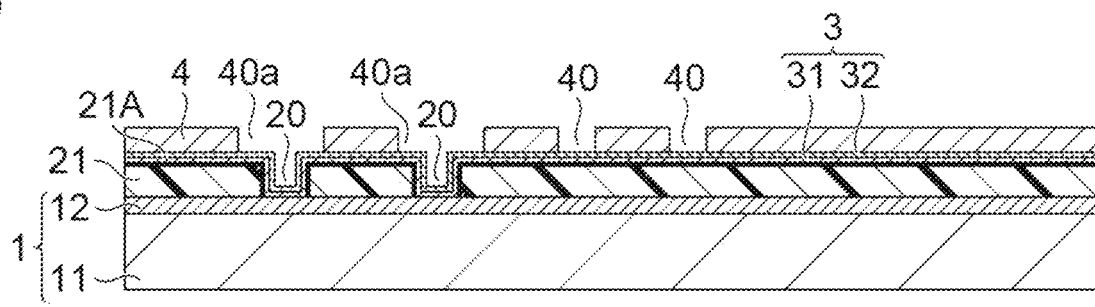
(b)
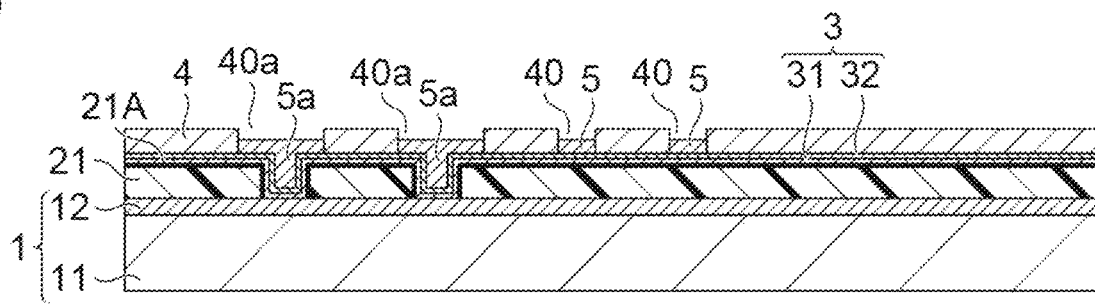
(c)
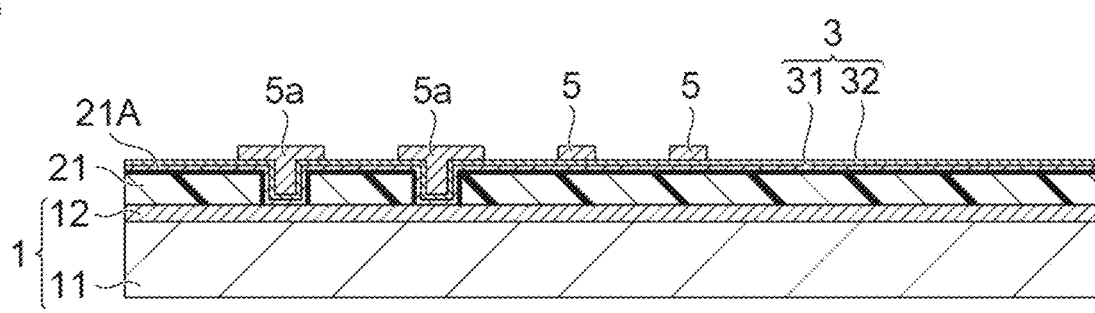
(d)
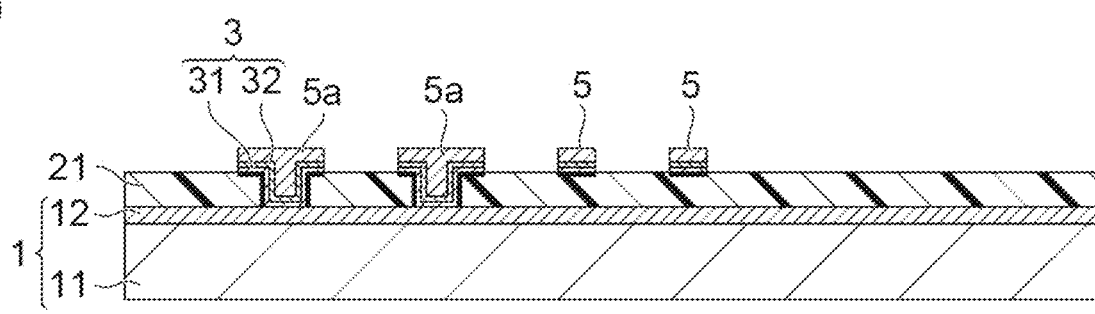

Fig.5
(a)
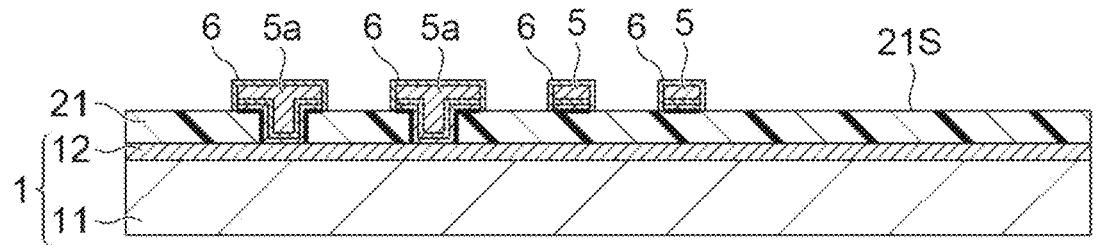
(b)
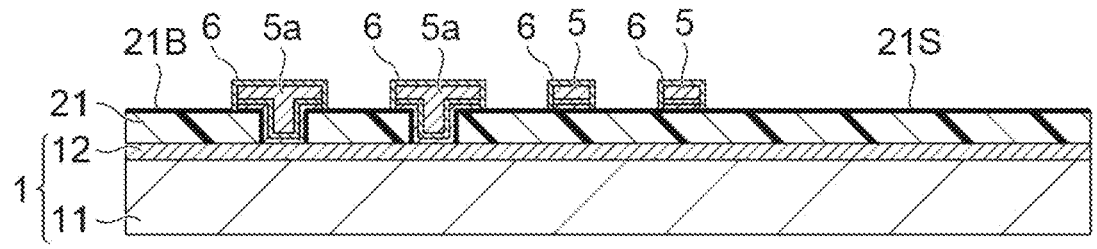
(c)
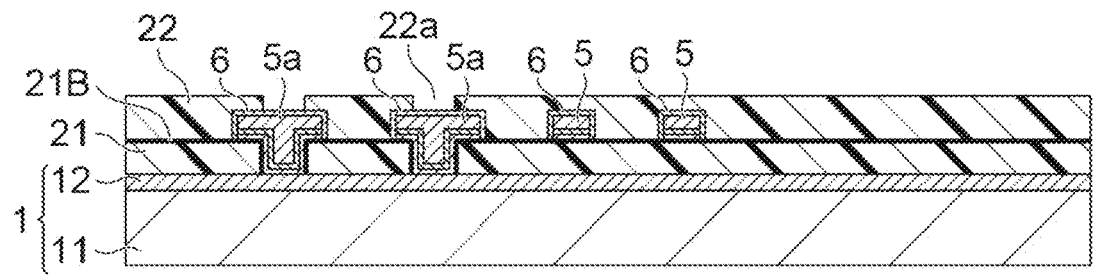
(d)
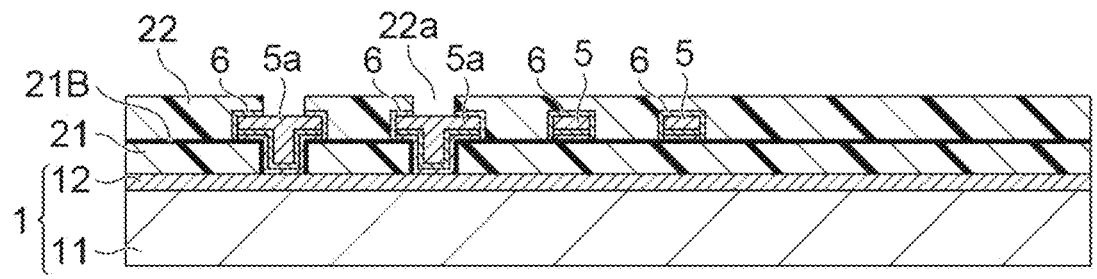

Fig.8
(a)
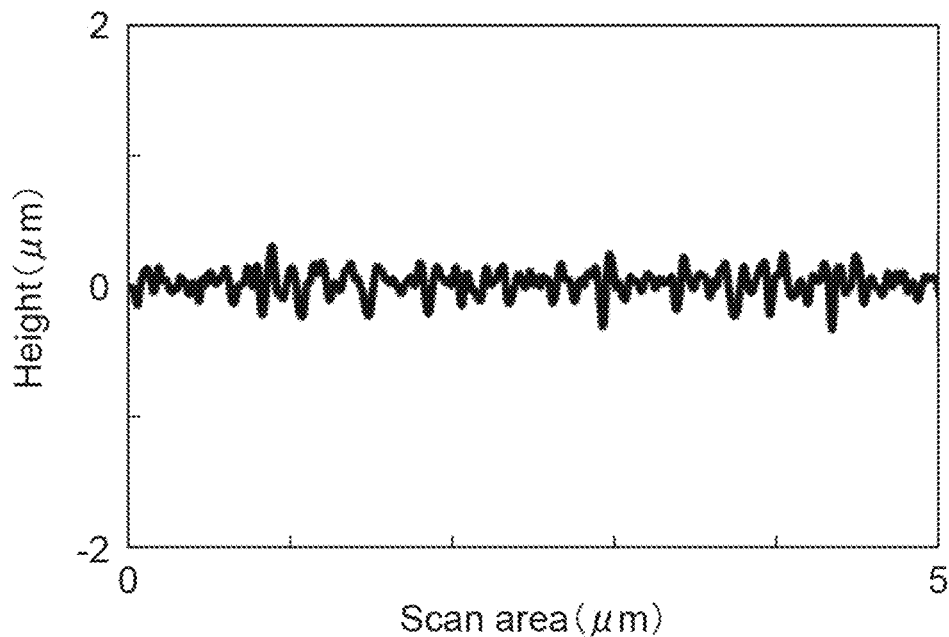
(b)
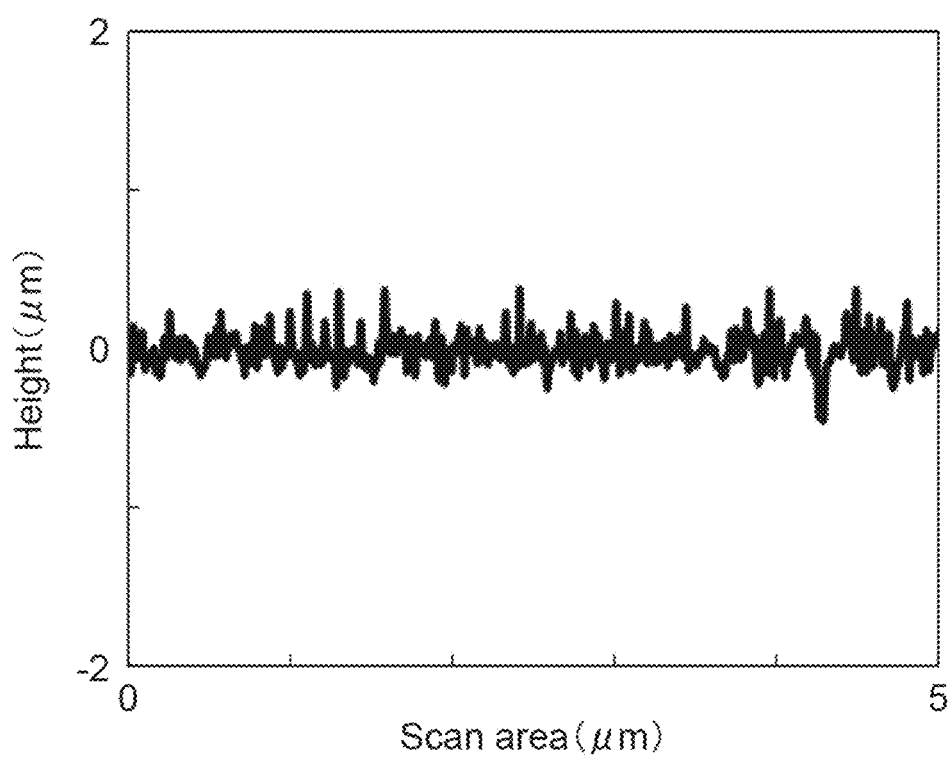

*Fig.10*
(a)
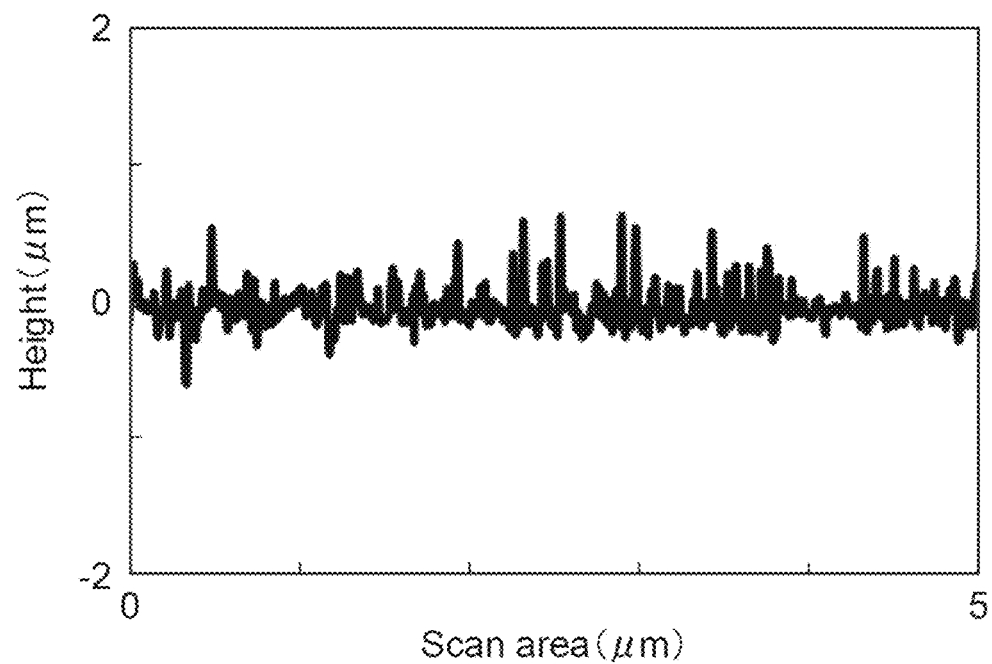
(b)
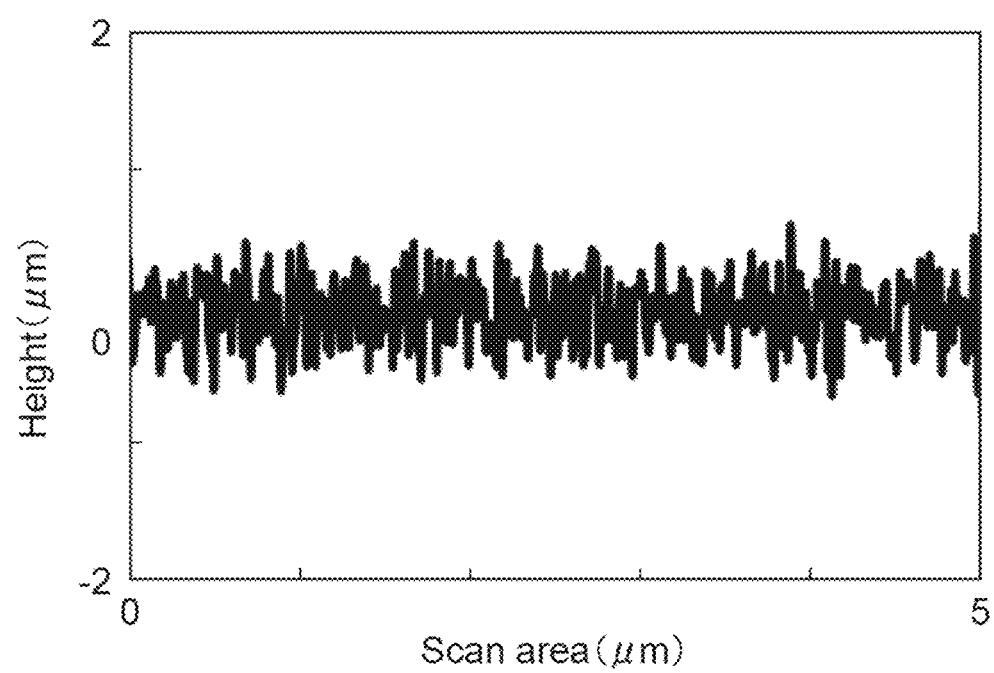

WIRING STRUCTURE, METHOD FOR MANUFACTURING SAME, AND SEMICONDUCTOR PACKAGE

CROSS-REFERENCE TO RELATED APPLICATIONS

This application is a U.S. national phase application filed under 35 U.S.C. § 371 of International Application No PCT/JP2021/023799, filed Jun. 23, 2021, designating the United States, which claims priority from Japanese application No. 2020-108669, filed Jun. 24, 2020, and Japanese application No. 2020-108697, filed Jun. 24, 2020 which are incorporated herein by reference in their entireties.

TECHNICAL FIELD

The present disclosure relates to a wiring structure, a method for manufacturing the same, and a semiconductor package.

BACKGROUND ART

With respect to mounting forms in which semiconductor chips having different performances are mixed in one package, the importance of high-density interconnect technology between semiconductor chips is increasing from the viewpoint of manufacturing cost (Patent Literature 1).

CITATION LIST

Patent Literature

Patent Literature 1: Japanese Unexamined Patent Publication No. 2003-318519

SUMMARY OF INVENTION

Technical Problem

In the technique described in Patent Literature 1, a seed layer is formed by electroless plating after treatment with a desmear treatment liquid. A conductive part is formed on the surface of the seed layer by supplying power to the seed layer. In the technique described in Patent Literature 1, wet desmear treatment is performed to roughen the surface of the insulating layer. By roughening the surface of the insulating layer, the adhesion between the seed layer and the insulating layer is improved by the anchor effect.

However, according to the knowledge of the present inventors, in the case of forming a fine wiring on the insulating resin layer, defects tend to occur in such a manner that the wiring collapses or a part of the wiring is separated from the insulating layer to cause a defect, if the surface of the insulating resin layer is roughened in order to obtain the anchor effect. In particular, this tendency is noticeable when forming a fine wiring having an L/S (line/space) of 10/10 µm or less.

Therefore, an aspect of the present disclosure relates to a method capable of manufacturing a wiring structure having a fine wiring provided on an insulating resin layer while suppressing the occurrence of wiring defects.

When manufacturing a wiring structure having two or more insulating resin layers and a wiring provided between the insulating resin layers adjacent to each other, a surface treatment agent layer that covers the surface of the wiring may be formed by treating the wiring with a surface treatment agent in order to improve the adhesion to the insulating resin layer. However, the adhesion between the adjacent insulating resin layers may be insufficient. In particular, in the case of an insulating resin layer for high frequency, the adhesion between the insulating resin layers tends to be insufficient since the polarity of the resin is low. Therefore, it is desired to improve the adhesion between the adjacent insulating resin layers while sufficiently maintaining the surface treatment agent layer that covers the wiring.

Another aspect of the present disclosure relates to a method for improving adhesion between adjacent insulating resin layers while leaving a surface treatment agent layer, when manufacturing a wiring structure having two or more insulating resin layers and a wiring provided between the insulating resin layers adjacent to each other by a method including forming the surface treatment agent layer for improving the adhesion of the surface of the wiring.

Solution to Problem

An aspect of the present disclosure provides a method for manufacturing a wiring structure including a step of forming a wiring on an insulating resin layer. The step of forming the wiring includes, in this order: forming a modified region including pores in a surface layer of the insulating resin layer by treating a surface of the insulating resin layer with a treatment method including surface modification; forming a seed layer including one or more metal layers on the surface of the insulating resin layer by sputtering; forming a resist having a pattern including an opening where the seed layer is exposed, on the seed layer; forming the wiring on the seed layer exposed in the opening by electrolytic copper plating; removing the resist; and removing a portion of the seed layer that is not covered by the wiring.

Another aspect of the present disclosure provides a wiring structure including: an insulating resin layer; a seed layer provided on the insulating resin layer and including one or more metal layers; and a copper wiring provided on the seed layer. A modified region including pores is formed in a surface layer of the insulating resin layer on the seed layer side, and a part of metal forming the seed layer penetrates into the pores.

Still another aspect of the present disclosure provides a semiconductor package including: the wiring structure; and a semiconductor chip connected to the wiring of the wiring structure.

Still another aspect of the present disclosure provides a method for manufacturing a wiring structure including, in this order: forming a seed layer including one or more metal layers on a surface of a first layer of the insulating resin layer; forming a resist having a pattern including an opening for wiring formation where the seed layer is exposed, on the seed layer; forming a wiring on the seed layer exposed in the opening by electrolytic copper plating; removing the resist; removing a portion of the seed layer that is not covered by the wiring to expose a portion of the surface of the first layer of the insulating resin layer that is not covered by the remaining seed layer; forming a surface treatment agent layer that covers a surface of the wiring by treating the surface of the wiring with a surface treatment agent for improving adhesion; forming a modified region including pores in a surface layer of the first layer of the insulating resin layer by treating the surface of the first layer of the insulating resin layer with a treatment method including surface modification; and forming a second layer of the insulating resin layer that covers the wiring on the first layer of the insulating resin layer.

Advantageous Effects of Invention

According to an aspect of the present disclosure, a wiring structure having the fine wiring provided on the insulating resin layer can be manufactured while suppressing the occurrence of wiring defects.

According to one aspect of the present disclosure, it is possible to improve the adhesion of the wiring while maintaining the surface roughness of the insulating resin layer relatively low. Therefore, it is possible to reduce the transmission loss due to the skin effect of the insulating resin layer.

According to an aspect of the present disclosure, it is possible to improve the adhesion between the adjacent insulating resin layers while leaving the surface treatment agent layer at it is in the case of manufacturing the wiring structure having two or more insulating resin layers and a wiring provided between the insulating resin layers adjacent to each other, using a method including forming a surface treatment agent layer for improving the adhesion of the surface of the wiring.

BRIEF DESCRIPTION OF DRAWINGS

FIG. 1 is a cross-sectional view schematically showing an example of a method for manufacturing a wiring structure.

FIG. 2 is a cross-sectional view schematically showing an example of a method for manufacturing a wiring structure.

FIG. 3 is a cross-sectional view schematically showing an example of a method for manufacturing a wiring structure.

FIG. 4 is a cross-sectional view schematically showing an example of a method for manufacturing a wiring structure.

FIG. 5 is a cross-sectional view schematically showing an example of a method for manufacturing a wiring structure.

FIG. 8 is a graph showing the unevenness of a surface of an insulating resin layer treated by emission of ultraviolet rays.

FIG. 10 is a graph showing the unevenness of a surface of an insulating resin layer treated by plasma treatment.

DESCRIPTION OF EMBODIMENTS

Figure 6:
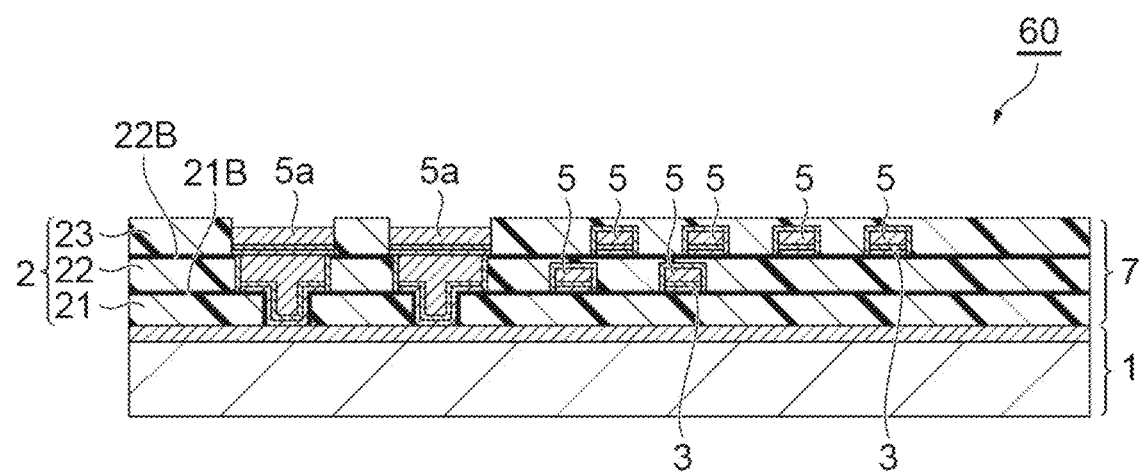
FIG. 6 is a cross-sectional view schematically showing an example of a method for manufacturing a wiring structure.

The present invention is not limited to the examples described below. In the following description, the same or equivalent portions are denoted by the same reference numerals, and repeated descriptions thereof may be omitted. The positional relationship such as up, down, right, and left is based on the positional relationship shown in the diagrams unless otherwise specified. In addition, the dimensional ratio of each diagram is not limited to the ratio shown in the diagram. Terms such as "left", "right", "front", "back", "top", "bottom", "upper", and "lower" do not necessarily mean that their relative positions do not change. The term "layer" includes not only a structure having a shape formed on the entire surface but also a structure having a shape partially formed when observed as a plan view.

FIGS. 1 to 3 are cross-sectional views schematically showing an example of a method for manufacturing a wiring structure. The method shown in FIGS. 1 to 3 includes: a step (I) of forming a first layer of the insulating resin layer 21 having a pattern including an opening 20 on a base material 1; a step (II) of forming a wiring 5 on the insulating resin layer 21; and a step (III) of forming a multilayer wiring part 7 including three or more of the insulating resin layers 21, 22, and 23 and two or more of the wirings 5 by forming two or more of the additional insulating resin layers 22 and 23 stacked on the insulating resin layer 21 and the additional wiring 5 provided between the additional insulating resin layers 22 and 23 adjacent to each other. By this method, a wiring structure 60 including the base material 1 and the multilayer wiring part 7 provided on the base material 1 can be obtained.

The wiring structure obtained by the method exemplified in FIGS. 1 to 3 can be applied to a semiconductor package that requires miniaturization and multi-pinning, for example, a semiconductor package having an interposer for mixing different types of semiconductor chips. More specifically, the wiring structure obtained by the method according to the present disclosure can form, for example, a semiconductor package in which the distance between pins is 200 μm or less or 30 to 100 μm and the number of pins is 500 or more or 1000 to 10000.

According to the method according to the present disclosure, the adhesion between a seed layer and an insulating resin layer can be improved by forming a modified region in the surface layer of the insulating resin layer. Therefore, as compared with a method including desmear treatment, a wiring structure having a fine wiring for making semiconductor chips electrically connected to each other can be manufactured with a better yield.

Step (I) of Forming the First Layer of the Insulating Resin Layer 21 Having a Pattern Including the Opening 20 on the Base Material 1

Step (I) includes: preparing a plate-shaped base material 1 having two main surfaces and providing the insulating resin layer 21 on one main surface of the base material 1 (FIG. 1(a)); and making the insulating resin layer 21 form a pattern including the opening 20 for connecting part formation where the base material 1 is exposed (FIG. 1(b)).

The base material 1 has an insulating substrate 11 and a conductive layer 12 provided on the insulating substrate 11. The insulating substrate 11 is not particularly limited, but may be, for example, a substrate including a silicon plate, a glass plate, a stainless steel plate, or a glass cloth. The conductive layer 12 that covers the entire main surface of the insulating substrate may not be provided. Instead of the conductive layer 12, a wiring and/or a pad may be provided on the insulating substrate 11. The base material 1 may be a semiconductor package having a semiconductor chip and a sealing resin layer sealing the semiconductor chip.

The thickness of the base material 1 may be 0.2 to 2.0 mm. If the thickness of the base material 1 is smaller than 0.2 mm, handling tends to be difficult. If the thickness of the base material 1 is larger than 2.0 mm, the material cost tends to be high. The base material 1 may have a disk shape or a panel shape. For example, the diameter of the disk-shaped base material 1 may be 200 to 450 mm. The panel-shaped base material 1 may have a rectangular main surface formed by sides each having a length of 300 to 700 mm.

The insulating resin layer 21 can be formed of, for example, a photosensitive resin composition. In the insulating resin layer 21 formed of a photosensitive resin composition, the fine opening 20 can be easily formed by photolithography. The photosensitive resin composition can have, for example, a liquid shape or a film shape. The film-shaped photosensitive resin composition is advantageous in terms of flatness of film thickness and cost. The insulating resin layer 21 may be formed of a thermosetting resin composition.

The insulating resin layer 21 may be provided by laminating the film-shaped photosensitive resin composition on the base material 1 at a relatively low temperature of 40 to 120° C. The film-shaped photosensitive resin composition that can be laminated at 40 to 120° C. tends to have an appropriate tack and suppress warpage.

The insulating resin layer 21 may contain a filler having an average particle size of 500 nm or less or 50 to 200 nm. The insulating resin layer 21 containing a filler is particularly easy to form a fine pattern. The content of the filler may be 0 to 70 parts by mass or 0 to 50 parts by mass with respect to 100 parts by mass of the total amount of the components other than the filler in the insulating resin layer 21.

The thickness of the insulating resin layer 21 may be 10 µm or less, 5 µm or less, or 3 µm or less. The thin insulating resin layer 21 tends to satisfactorily form the fine opening 20. The thickness of the insulating resin layer 21 may be 1 µm or more from the viewpoint of insulation reliability.

As shown in FIG. 1(b), by removing a part of the insulating resin layer 21 provided on the base material 1, a pattern including the opening 20 where the base material 1 is exposed is formed. The opening 20 is a recess formed by an inner wall extending in the thickness direction of the insulating resin layer 21 and a bottom surface that is the surface of the base material 1 (or the conductive layer 12). The shape of the opening 20 for connecting part formation when viewed from a direction perpendicular to the main surface of the insulating resin layer 21 may be circular or elliptical. The area of the opening 20 when viewed from the direction perpendicular to the main surface of the insulating resin layer 21 may be an area corresponding to the area of a circle having a diameter of 5 to 50 µm or 5 to 10 µm.

The opening 20 can be formed, for example, by laser ablation, photolithography, or imprinting. When the insulating resin layer 21 is formed of a photosensitive resin material, the opening 20 can be easily formed by photolithography including exposure and development. The exposure method for photolithography may be, for example, a projection exposure method, a contact exposure method, or a direct drawing exposure method. An alkaline aqueous solution containing sodium carbonate or TMAH (tetramethylammonium hydroxide) may be used for development.

After the opening 20 is formed by photolithography, the insulating resin layer 21 may be further heat-cured. The heating temperature for thermosetting may be 100 to 200° C. The heating time for thermosetting may be 30 minutes to 3 hours. If there is a residue of the insulating resin layer 21 on the bottom surface of the opening 20, the residue may be removed by oxygen plasma treatment, argon plasma treatment, or nitrogen plasma treatment.

The coefficient of thermal expansion of the insulating resin layer 21 having a pattern including the opening 20 may be $80 \times 10^{-6}$/K or less, or $70 \times 10^{-6}$/K or less. The coefficient of thermal expansion of the insulating resin layer 21 may be $20 \times 10^{-6}$/K or more for stress relaxation of the insulating resin layer 21 and easy formation of a high-definition pattern.

Step (II) of Forming the Wiring 5 on the Insulating Resin Layer 21

Step (II) includes, in this order: forming a modified region 21A including pores in the surface layer of the insulating resin layer 21 by treating a surface 21S, which is the main surface of the insulating resin layer 21 on a side opposite to the base material 1, once or more by with a treatment method including surface modification (FIG. 1(c)); forming a seed layer 3 on the surface 21S by sputtering (FIGS. 1(d) and 1(e)); forming a resist 4 having a pattern including openings 40 and 40a where the seed layer 3 is exposed, on the seed layer 3 (FIG. 2(a)); forming the wiring 5 and a connecting part 5a on the seed layer 3 exposed in the openings 40 and 40a by electrolytic copper plating (FIG. 2(b)); removing the resist 4 (FIG. 2(c)); and removing a portion of the seed layer 3 that is not covered by the wiring 5 or the connecting part 5a (FIG. 2(d)).

By forming a modified region in the surface layer on the surface 21S side of the insulating resin layer 21, it is possible to improve the adhesion between the insulating resin layer 21 and the seed layer 3 formed by sputtering while maintaining the surface roughness of the surface 21S low to some extent. The modified region 21A may include a plurality of fine pores communicating with the surface 21S. In the process of forming the seed layer 3 by sputtering, a part of the metal forming the seed layer 3 penetrates into the pores of the modified region 21A. As a result, it is thought that the adhesion between the seed layer 3 and the insulating resin layer 21 is improved. The formation of pores can be confirmed, for example, by observing the cross section of the insulating resin layer 21 with a scanning transmission electron microscope.

The treatment method for forming a modified region may be at least one treatment method selected from a group consisting of electron beam emission, ozone water treatment, and corona discharge treatment, or may be ultraviolet emission. The ultraviolet emission has advantages that vacuum equipment is not required and waste liquid is not generated. The ultraviolet emission may be ultraviolet emission in which ultraviolet rays are emitted from an incoherent light source. The incoherent light source is advantageous in that ultraviolet rays can be efficiently emitted to a wide region of the insulating resin layer 21 as compared with a coherent light source, such as a laser light source. Examples of the incoherent light source include a high-pressure mercury lamp, a low-pressure mercury lamp, and an excimer lamp. The incoherent light source may be a low-pressure mercury lamp or an excimer lamp having a large activation effect.

The treatment (for example, ultraviolet emission) for forming the modified region 21A can be performed, for example, in the atmosphere or in an oxygen atmosphere. In the treatment for forming the modified region 21A, the temperature of the insulating resin layer 21 may be 25° C. to 100° C., 40° C. to 100° C., or 60° C. to 100° C. If the temperature is high, the modified region 21A can be formed more efficiently.

The surface 21S of the insulating resin layer 21 including the modified region 21A may have a surface roughness Ra of 70 nm or less. If the surface roughness Ra is small, defects in the fine wiring 5 are less likely to occur. Since the modified region 21A is formed, the adhesion between the insulating resin layer 21 and the seed layer 3 can be sufficiently improved even if the surface roughness Ra is small.

The modified region 21A may be formed up to a depth of 50 nm or more from the surface 21S of the insulating resin layer 21. When the modified region 21A is formed deeply, the effect of improving the adhesion is likely to be obtained more noticeably. The depth of the modified region 21A from the surface 21S may be 200 nm or less.

After the modified region 21A is formed, the contact angle between the surface 21S of the insulating resin layer 21 and pure water may be 40° or less or 10° or less.

After the modified region 21A is formed, an adhesion layer 31 and a power supply layer 32 are sequentially formed on the surface 21S by sputtering. The seed layer 3 is configured to include the adhesion layer 31 and the power supply layer 32. The seed layer 3 including the adhesion layer 31 and the power supply layer 32 may be formed by electroless plating.

The adhesion layer 31 may be, for example, a metal layer containing titanium, chromium, tungsten, nickel, or an alloy containing two or more kinds of metals selected from these. The thickness of the adhesion layer 31 may be, for example, 20 to 200 nm, 40 to 200 nm, or 60 to 200 nm.

The power supply layer 32 functions as a power supply layer for electrolytic copper plating for forming the wiring 5. The power supply layer 32 is typically a metal layer containing copper. The thickness of the power supply layer 32 may be, for example, 90 to 200 nm, 100 to 200 nm, or 150 to 300 nm.

After the seed layer 3 is formed, the insulating resin layer 21 and the seed layer 3 may be annealed in order to further improve the adhesive force between the adhesion layer 31 and the insulating resin layer 21. The heating temperature for annealing may be 80 to 200° C., 120 to 200° C., or 120 to 180° C. The heating time for annealing may be 5 to 60 minutes, 10 to 60 minutes, or 20 to 60 minutes.

The resist 4 for wiring formation having a pattern including an opening 40 for wiring formation and an opening 40a for connecting part formation is formed on the seed layer 3. As shown in FIG. 2(a), the opening 40a for connecting part formation is formed so that the opening 20 of the first layer of the insulating resin layer 21 is located thereinside. As a result, a recess formed by the opening 20 having the seed layer 3 as its inner wall and the opening 40a communicating with the opening 20 is formed on the base material 1.

The opening 40 for wiring formation is formed at a position other than the opening 20 on the seed layer 3. The shape of the opening 40 for wiring formation when viewed from a direction perpendicular to the main surface of the insulating resin layer 21 may include a linear portion. The width of the opening 40 (width of the linear portion) may be 1 to 10 μm or 1 to 5 μm. The width of the opening 40 corresponds to the width of the formed wiring 5. If the width of the opening 40 is small, it is easy to provide a semiconductor device in which a high density is realized.

The shape of the opening 40a for connecting part formation when viewed from a direction perpendicular to the main surface of the insulating resin layer 21 may be circular or elliptical. The opening 40 when viewed from the direction perpendicular to the main surface of the insulating resin layer 21 may have an area corresponding to the area of a circle having a diameter of 5 to 50 μm or 5 to 10 μm.

The resist 4 can be selected from those used in the related art. For example, a negative film type photosensitive resist (Photec RY-5107UT manufactured by Hitachi Chemical Company, Ltd.) can be used. A recess of a resist for circuit formation can be formed by forming a resist for circuit formation first by using a commercially available roll laminator, then bringing a photo tool with a pattern into close contact with the resist and performing exposure using an exposure machine, and then performing spray development with a sodium carbonate aqueous solution. A positive type photosensitive resist may be used instead of the negative type.

The wiring 5 is formed by electrolytic copper plating on the seed layer 3 (power supply layer 32) exposed in the opening 40 for wiring formation. At the same time, the connecting part 5a filling the opening 40a and the opening 20 is formed on the seed layer 3 (power supply layer 32) exposed in the opening 40a for connecting part formation and in the opening 20.

The wiring 5 may include a linear portion having a width of 1 to 10 μm or 1 to 5 μm. According to the method according to the present disclosure, the wiring 5 including a linear portion having a small width, that is, the wiring 5 with a pattern having a small L/S can be easily manufactured while suppressing the occurrence of defects. The thickness of the wiring 5 may be 1 to 10 μm, 3 to 10 μm, or 5 to 10 μm.

After the wiring 5 is formed, the resist 4 is separated from the seed layer 3. The resist 4 can be easily removed by using a commercially available stripping solution.

Subsequently, a portion of the seed layer 3 that is not covered by the wiring 5 or the connecting part 5a is removed. The seed layer 3 can be easily removed by using a commercially available etching solution. Specific examples of the commercially available etching solution include WLC-C2 manufactured by MITSUBISHI GAS CHEMICAL COMPANY, INC., which is suitable for removing the power supply layer 32, and WLC-T manufactured by MITSUBISHI GAS CHEMICAL COMPANY, INC., which is suitable for removing the adhesion layer 31.

Step (III) of Forming the Multilayer Wiring Part 7

Step (III) may include forming two or more additional insulating resin layers 22 and 23 and one or more additional wiring 5 by repeating the same steps as in the formation of the first layer of the insulating resin layer 21 and the formation of the wiring 5 and the connecting part 5a. Specifically, step (III) may include, in this order: forming an additional insulating resin layer 22 on the first layer of the insulating resin layer 21; forming a modified region including pores in the surface layer of the additional insulating resin layer 22 by treating the surface of the additional insulating resin layer 22 with a treatment method including surface modification; forming a seed layer including an adhesion layer and a power supply layer on the surface of the additional insulating resin layer 22 by sputtering; forming a resist having a pattern including an opening for wiring formation where the seed layer is exposed, on the seed layer; forming an additional wiring by electrolytic copper plating on the seed layer exposed in the opening for wiring formation of the resist; removing the resist; and removing a portion of the seed layer that is not covered by the additional wiring. The treatment method for treating the surface of the additional insulating resin layer 22 may also be at least one treatment method selected from a group consisting of ultraviolet emission, electron beam emission, ozone water treatment, and corona discharge treatment.

The second layer of the insulating resin layer 22 that is added has a pattern including an opening for connecting part formation where the lower-layer connecting part 5a formed in the opening 20 of the first layer of the insulating resin layer 21 is exposed. The seed layer formed on the additional insulating resin layer 22 extends onto a lower layer of the connecting part 5a exposed in the opening for connecting part formation of the insulating resin layer 22. The pattern of the resist further includes an opening for connecting part formation where the seed layer formed in the opening for connecting part formation of the additional insulating resin layer 22 is exposed. On the seed layer exposed in the opening for connecting part formation, the connecting part is formed by electrolytic copper plating together with additional wiring. The insulating resin layers of the second and subsequent layers can have the same thickness as the first layer of the insulating resin layer.

In addition, by repeating the same steps except that the additional wiring is not formed, the insulating resin layer 23 of the uppermost layer and the connecting part 5a including a portion filling the opening of the insulating resin layer 23 are formed.

FIGS. 4 to 6 are cross-sectional views schematically showing another example of the method for manufacturing a wiring structure. The method shown in FIGS. 4 to 6 includes, in this order: a step of forming the first layer of the insulating resin layer 21 having a pattern including the opening 20 on the base material 1; a step of forming the seed layer 3 on the surface 21S of the first layer of the insulating resin layer 21; a step of forming the resist 4 having a pattern including the opening 40 for wiring formation where the seed layer 3 is exposed, on the seed layer 3; a step of forming the wiring 5 by electrolytic copper plating on the seed layer 3 exposed in the opening 40; a step of removing the resist 4; a step of forming a surface treatment agent layer 6 that covers the surface of the wiring 5 by treating the surface of the wiring 5 with a surface treatment agent for improving adhesion; a step of forming a modified regions 21B including pores in the surface layer of the first layer of the insulating resin layer 21 by treating the surface 21S of the first layer of the insulating resin layer 21 with a treatment method including surface modification; a step of forming the second layer of the insulating resin layer 22 that covers the wiring 5 on the first layer of the insulating resin layer 21; and a step of forming the multilayer wiring part 7 including three layers of the insulating resin layers 21, 22, and 23 and two layers of the wirings 5 by forming the second layer of the wiring 5 provided on the second layer of the insulating resin layer 22 and the additional third layer of the insulating resin layer 23 stacked on the second layer of the insulating resin layer 22. The step of forming the first layer of the insulating resin layer 21 having a pattern including the opening 20 on the base material 1 and the step of forming the seed layer 3 on the surface 21S of the first layer of the insulating resin layer 21 can be performed by using the same method as in the example shown in FIG. 1. The seed layer 3 may be formed by electroless plating.

The wiring structure obtained by the method exemplified in FIGS. 4 to 6 can be applied to a semiconductor package that requires miniaturization and multi-pinning, for example, a semiconductor package having an interposer for mixing different types of semiconductor chips. More specifically, the wiring structure obtained by the method according to the present disclosure can form, for example, a semiconductor package in which the distance between pins is 200 μm or less or 30 to 100 μm and the number of pins is 500 or more or 1000 to 10000.

According to the method according to the present disclosure, by forming a modified region in the surface layer of the insulating resin layer, it is possible to improve the adhesion between the insulating resin layers while maintaining the effect of improving the adhesion of the wiring with the surface treatment agent high. Therefore, as compared with a method including desmear treatment, a wiring structure having a fine wiring for making semiconductor chips electrically connected to each other can be manufactured with a better yield.

Before the seed layer 3 is formed, similarly to the method exemplified in FIG. 1, the surface 21S that is the main surface of the insulating resin layer 21 on a side opposite to the base material 1 may be treated once or more by a treatment method including surface modification to form the modified region 21A including pores in the surface layer of the insulating resin layer 21. The formation of the modified region 21A before the seed layer 3 is formed can be performed by the same method as in the formation of the modified region 21B after being exposed by the removal of the seed layer 3 described later. In the process of forming the seed layer 3 by sputtering, a part of the metal forming the seed layer 3 penetrates into the pores of the modified region 21A. As a result, it is thought that the adhesion between the seed layer 3 and the insulating resin layer 21 is improved.

The resist 4 for wiring formation having a pattern including the opening 40 for wiring formation and the opening 40a for connecting part formation, is formed on the seed layer 3. As shown in FIG. 4(a), the opening 40a for connecting part formation is formed so that the opening 20 of the first layer of the insulating resin layer 21 is located thereinside. As a result, a recess formed by the opening 20 having the seed layer 3 as its inner wall and the opening 40a communicating with the opening 20 is formed on the base material 1.

The opening 40 for wiring formation is formed at a position other than the opening 20 on the seed layer 3. The shape of the opening 40 for wiring formation when viewed from a direction perpendicular to the main surface of the insulating resin layer 21 may include a linear portion. The width of the opening 40 (width of the linear portion) may be 1 to 10 μm or 1 to 5 μm. The width of the opening 40 corresponds to the width of the formed wiring 5. If the width of the opening 40 is small, it is easy to provide a semiconductor device in which a high density is realized.

The shape of the opening 40a for connecting part formation when viewed from a direction perpendicular to the main surface of the insulating resin layer 21 may be circular or elliptical. The opening 40 when viewed from the direction perpendicular to the main surface of the insulating resin layer 21 may have an area corresponding to the area of a circle having a diameter of 5 to 50 μm or 5 to 10 μm.

The resist 4 can be selected from those used in the related art. For example, a negative film type photosensitive resist (Photec RY-5107UT manufactured by Hitachi Chemical Company, Ltd.) can be used. A recess of a resist for circuit formation can be formed by forming a resist for circuit formation first by using a commercially available roll laminator, then bringing a photo tool with a pattern into close contact with the resist and performing exposure using an exposure machine, and then performing spray development with a sodium carbonate aqueous solution. A positive type photosensitive resist may be used instead of the negative type.

The wiring 5 is formed by electrolytic copper plating on the seed layer 3 (power supply layer 32) exposed in the opening 40 for wiring formation. At the same time, the connecting part 5a filling the opening 40a and the opening 20 is formed on the seed layer 3 (power supply layer 32) exposed in the opening 40a for connecting part formation and in the opening 20.

The wiring 5 may include a linear portion having a width of 1 to 10 μm or 1 to 5 μm. According to the method according to the present disclosure, the wiring 5 including a linear portion having a small width, that is, the wiring 5 with a pattern having a small L/S can be easily manufactured while suppressing the occurrence of defects. The thickness of the wiring 5 may be 1 to 10 μm, 3 to 10 μm, or 5 to 10 μm.

After the wiring 5 is formed, the resist 4 is separated from the seed layer 3. The resist 4 can be easily removed by using a commercially available stripping solution.

Subsequently, a portion of the seed layer 3 that is not covered by the wiring 5 or the connecting part 5a is removed. The seed layer 3 can be easily removed by using a commercially available etching solution. Specific examples of the commercially available etching solution include WLC-C2 manufactured by MITSUBISHI GAS CHEMICAL COMPANY, INC., which is suitable for removing the power supply layer 32, and WLC-T manufactured by MITSUBISHI GAS CHEMICAL COMPANY, INC., which is suitable for removing the adhesion layer 31. The modified region 21A may be removed together with the seed layer 3.

The surface of the wiring 5 is treated with a surface treatment agent. The surface treatment agent can be selected from those normally used as surface treatment agents for improving the adhesion between the resin and the copper wiring. For example, the surface treatment agent may be a surface treatment agent containing an organic component. By the treatment using the surface treatment agent containing an organic component, the surface treatment agent layer 6 that contains an organic component and covers the surface of the wiring 5 is formed. Examples of a commercially available surface treatment agent containing an organic component include "GliCAP" (product name) manufactured by SHIKOKU CHEMICALS CORPORATION, "Novabond" (product name) manufactured by Atotech Japan K.K., and "CZ8401" and "CZ-8402" manufactured by MEC COMPANY LTD. The surface of the wiring 5 may be finely etched before the treatment using the surface treatment agent.

After treating the surface of the wiring 5 with the surface treatment agent, the modified region 21B including pores is formed in the surface layer of the first layer of the insulating resin layer 21 on the surface 21S side by using a treatment method including surface modification, so that it is possible to improve the adhesion between the first layer of the insulating resin layer 21 and the second layer of the insulating resin layer 22 formed on the first layer of the insulating resin layer 21 while suppressing the disappearance of the surface treatment agent layer 6. The modified region 21B may include a plurality of fine pores communicating with the surface 21S. In the process of forming the second layer of the insulating resin layer 22, a part of the resin forming the insulating resin layer 22 penetrates into the pores of the modified region 21B. As a result, it is thought that the adhesion between the layer 3 and the insulating resin layers 21 and 22 adjacent to each other is improved. The formation of pores can be checked, for example, by observing the cross section of the insulating resin layer 21 with a scanning transmission electron microscope. A similar modified region can also be formed in the surface layer of the surface treatment agent layer 6.

The treatment method for forming the modified region 21B may be at least one treatment method selected from a group consisting of ultraviolet emission, electron beam emission, ozone water treatment, and corona discharge treatment, or may be ultraviolet emission. The ultraviolet emission has advantages that vacuum equipment is not required and waste liquid is not generated. The ultraviolet emission may be ultraviolet emission in which ultraviolet rays are emitted from an incoherent light source. The incoherent light source is advantageous in that ultraviolet rays can be efficiently emitted to a wide region of the insulating resin layer 21 as compared with a coherent light source, such as a laser light source. Examples of the incoherent light source include a high-pressure mercury lamp, a low-pressure mercury lamp, and an excimer lamp. The incoherent light source may be a low-pressure mercury lamp or an excimer lamp having a large activation effect.

The treatment (for example, ultraviolet emission) for forming the modified region 21B can be performed, for example, in the atmosphere or in an oxygen atmosphere. In the treatment for forming the modified region 21B, the temperature of the insulating resin layer 21 may be 25 to 100° C., 40° C. to 100° C., or 60° C. to 100° C. If the temperature is high, the modified region 21A can be formed more efficiently.

After the modified region 21B is formed, the contact angle between the surface 21S of the insulating resin layer 21 and pure water may be 40° or less or 10° or less.

After the modified region 21B is formed, the second layer of the insulating resin layer 22 that covers the wiring 5 is formed on the first layer of the insulating resin layer 21. The second layer of the insulating resin layer 22 has a pattern including an opening 22a where the surface treatment agent layer 6 that covers the connecting part 5a formed in the opening 20 of the first layer of the insulating resin layer 21 is exposed. The second layer of the insulating resin layer 22 can be formed by using a photosensitive resin composition or a thermosetting resin composition that is the same as or different from the photosensitive resin composition or the thermosetting resin composition used to form the first layer of the insulating resin layer 21. The insulating resin layers of the second and subsequent layers can have the same thickness as the first layer of the insulating resin layer.

After the second layer of the insulating resin layer 22 is formed, the surface treatment agent layer 6 exposed in the opening 22a is removed. By removing the surface treatment agent layer 6, the first layer of the connecting part 5a is exposed in the opening 22a. The surface treatment agent layer 6 can be removed by, for example, desmear treatment, copper etching solution treatment, oxygen plasma treatment, argon plasma treatment, nitrogen plasma treatment, fluorine plasma treatment, ultraviolet treatment, or a combination thereof. From the viewpoint of removal efficiency, the surface treatment agent layer 6 may be removed by a combination of oxygen plasma and sodium persulfate aqueous solution.

By forming the second layer of the wiring 5 provided on the second layer of the insulating resin layer 22 and the additional third layer of the insulating resin layer 23 stacked on the second layer of the insulating resin layer 22, the multilayer wiring part 7 including three layers of the insulating resin layers 21, 22, and 23 and two layers of the wirings 5 is formed.

For example, the step of forming the multilayer wiring part 7 may include, in this order: forming a seed layer including one or more metal layers and extending onto the first layer of the connecting part 5a exposed in the opening 22a for connecting part formation, on the surface of the second layer of the insulating resin layer 22; forming a resist having a pattern including an opening for wiring formation where the seed layer is exposed, on the seed layer; forming the second layer of the wiring 5 by electrolytic copper plating on the seed layer exposed in the opening for wiring formation of the resist; removing the resist; removing a portion of the seed layer that is not covered by the second layer of the wiring 5 to expose a portion of the surface of the second layer of the insulating resin layer 22 that is not covered by the remaining seed layer; forming a surface treatment agent layer by treating the surface of the second layer of the wiring 5 with a surface treatment agent; forming a modified region including pores in the surface layer of the second layer of the insulating resin layer 22 by treating the surface of the second layer of the insulating resin layer 22 with a treatment method including surface modification; and forming the third layer of the insulating resin layer 23 that covers the second layer of the wiring 5 on the second layer of the insulating resin layer 22. The treatment method for treating the surface of the second layer of the insulating resin layer 22 may also be at least one treatment method selected from a group consisting of ultraviolet emission, electron beam emission, ozone water treatment, and corona discharge treatment.

The seed layer formed on the second layer of the insulating resin layer 22 extends onto the lower-layer connecting part 5a exposed in the opening 22a for connecting part formation of the insulating resin layer 22. The pattern of the resist formed on the seed layer further includes an opening for connecting part formation where the seed layer formed in the opening 22a for connecting part formation of the second layer of the insulating resin layer 22 is exposed. On the seed layer exposed in the opening for connecting part formation, the second layer of the connecting part 5a is formed by electrolytic copper plating together with the second layer of the wiring 5. The third layer of the insulating resin layer 23 has a pattern including an opening where the second layer of the connecting part 5a is exposed.

The step of forming the multilayer wiring part 7 may further include forming insulating resin layers of fourth and subsequent layers and wirings of third and subsequent layers by further repeating the same steps.

The wiring structure 60 formed by using the method described above has the base material 1 and the multilayer wiring part 7 provided on the base material 1. The multilayer wiring part 7 includes an insulating layer 2 configured to include a plurality of insulating resin layers 21, 22, and 23, the seed layer 3 provided on the insulating resin layers 21 and 22, and the wiring 5 (copper wiring) provided on the seed layer 3. A clear interface may not necessarily be formed between adjacent insulating resin layers, and the boundary between the two insulating resin layers may not be clear.

A modified region including pores may be formed in the surface layers of the insulating resin layers 21 and 22 on the seed layer 3 side. A part of the metal forming the seed layer 3 may penetrate into the pores. In other words, a part of the metal forming the seed layer 3 may be dispersed throughout the modified region. Since the metal of the seed layer penetrates into the modified region, the adhesion between the insulating resin layer and the seed layer is improved. The dispersion of the metal in the modified region can be checked, for example, by analyzing the cross section of the insulating resin layer by energy dispersive X-ray fluorescence analysis (EDX).

Figure 7:
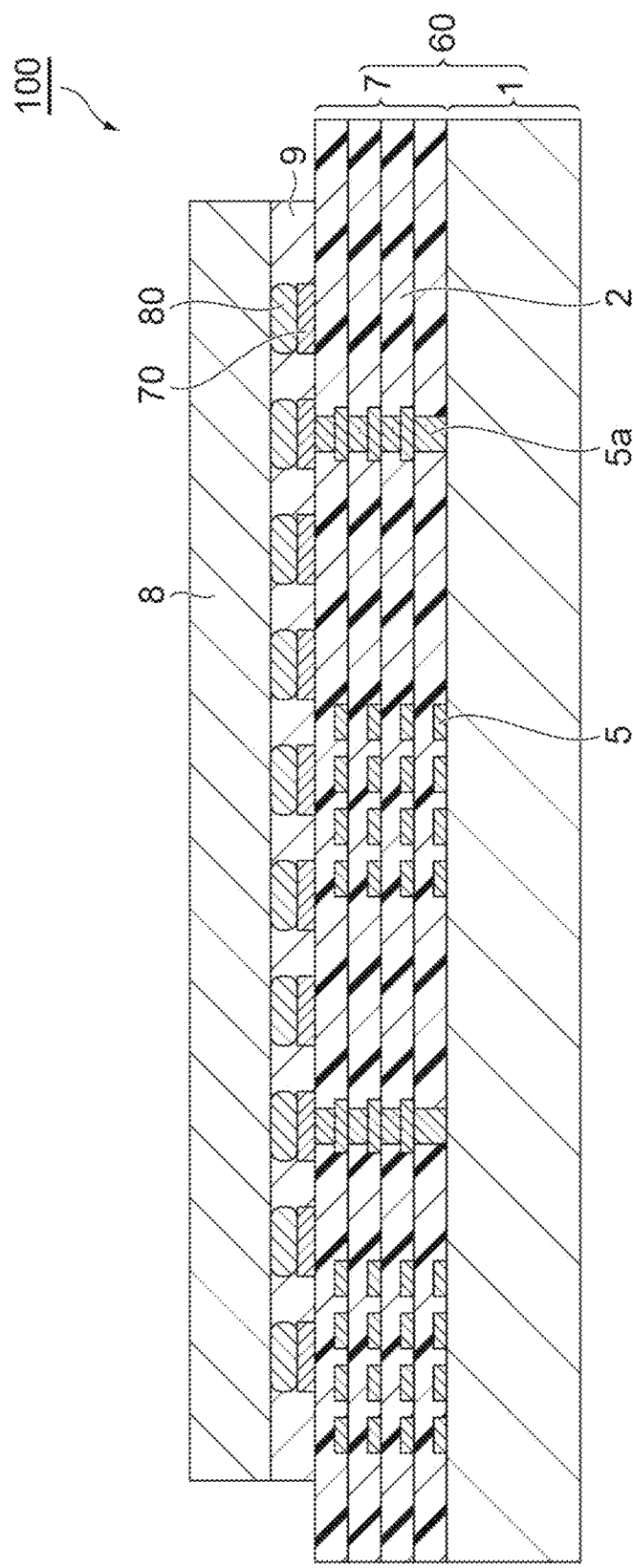
FIG. 7 is a schematic cross-sectional view showing an example of a semiconductor package.

The wiring structure can be used as a wiring substrate for mounting an electronic component such as a semiconductor chip. For example, the wiring structure may be a rewiring layer of a semiconductor chip. FIG. 7 is a cross-sectional view showing an example of a semiconductor package including a wiring structure. A semiconductor package 100 shown in FIG. 7 includes the wiring structure 60 and a semiconductor chip 8 connected to the wiring 5 of the wiring structure 60. A solder ball 80 for connection is provided on the back surface of the semiconductor chip 8. The wiring structure 60 has a connection pad 70 provided on the multilayer wiring part 7. Since the solder ball 80 and the connection pad 70 are bonded to each other, the semiconductor chip 8 is electrically connected to the wiring structure 60. An underfill 9 filling the space between the semiconductor chip 8 and the wiring structure 60 is also provided.

EXAMPLES

The present invention is not limited to the following examples.
Examination I
1. Manufacture of a Wiring Structure Example 1

(1) Formation of an Insulating Resin Layer
The following materials were mixed to prepare a solution containing a photosensitive resin composition for forming an insulating resin layer.
Photoreactive Resin:
  Acid-modified cresol novolac type epoxy acrylate having a carboxyl group and an ethylenically unsaturated group (CCR-1219H, manufactured by Nippon Kayaku Co., Ltd., product name)
Photoinitiator:
  2,4,6-trimethylbenzoyl-diphenyl-phosphinoxide (Darocure TPO, manufactured by Ciba Japan K.K., product name), and ethanone, 1-[9-ethyl-6-(2-methylbenzoyl)-9H-carbazol-3-yl]-, 1-(o-acetyloxime) (Irgacure OXE-02, manufactured by Ciba Japan K.K., product name)
Thermosetting Component:
  Biphenol type epoxy resin (YX-4000, manufactured by Japan Epoxy Resin Co., Ltd., product name)
Filler:
  Silica filler surface-treated with vinylsilane (average particle size 50 nm)

The dispersion state of the silica filler in the solution was measured by using the dynamic light scattering nanotrack particle size distribution meter "UPA-EX150" (manufactured by NIKKISO CO., LTD.) and the laser diffraction scattering type microtrack particle size distribution meter "MT-3100" (manufactured by NIKKISO CO., LTD.). It was confirmed that the silica filler was dispersed so that the maximum particle size was 1 μm or less.

The solution of the photosensitive resin composition was uniformly applied onto a 16 μm-thick polyethylene terephthalate film (G2-16, manufactured by TEIJIN LIMITED, product name). The coating film was dried by heating at 100° C. for about 10 minutes to form a photosensitive resin layer having a film thickness of 15 μm.

A base material (200 mm×200 mm square, thickness 1.5 mm) having an insulating substrate including a glass cloth and a copper layer (thickness 20 μm) provided on the surface of the insulating substrate was prepared. A photosensitive resin layer was placed on the surface of the copper layer of the base material, and the whole was pressed by using a press-type vacuum laminator (MVLP-500, manufactured by Meiki Co., Ltd.). The photosensitive resin layer was stacked on the base material by pressing. The pressing conditions were a press hot plate temperature of 80° C., a vacuum drawing time of 20 seconds, a laminating press time of 60 seconds, an atmospheric pressure of 4 kPa or less, and a crimping pressure of 0.4 MPa.

(2) Formation of an Insulating Resin Layer Having an Opening

A photo tool having a pattern including an opening was brought into close contact with the photosensitive resin layer on the base material. Then, the photosensitive resin layer was exposed with the amount of energy of 30 mJ/cm$^2$ by using an i-line stepper exposure machine (product name:

S6CK type exposure machine, lens: ASC3 (Ck), manufactured by CERMA PRECISION, INC.). An insulating resin layer having a pattern including an opening where the surface of the base material was exposed was formed by spray development for 45 seconds using a 1% by mass sodium carbonate aqueous solution at 30° C. The developed insulating resin layer was post-UV exposed with the amount of energy of 2000 mJ/cm$^2$ by using a mask exposure machine (EXM-1201 type exposure machine, manufactured by ORC MANUFACTURING CO., LTD.). Then, the insulating resin layer was heat-cured by heating at 170° C. for 1 hour in a clean oven.

(3) Formation of a Modified Region

The entire surface of the heat-cured insulating resin layer was irradiated with ultraviolet rays by using an ultraviolet emission device (SSP-16, manufactured by SEN LIGHTS Corporation) having an ultraviolet lamp. The distance from the ultraviolet lamp to the surface of the insulating resin layer was 40 mm, and the treatment time by ultraviolet emission was 30 seconds, 45 seconds, 60 seconds, 120 seconds, 180 seconds, 300 seconds, or 600 seconds. By ultraviolet emission, a modified region including fine pores was formed in the surface layer of the insulating resin layer.

(4) Formation of a Seed Layer

A Ti layer having a thickness of 150 nm was formed as an adhesion layer on the surface of the insulating resin layer including the modified region by using a sputtering device (SIV-500, manufactured by ULVAC, Inc.). A Cu layer having a thickness of 200 nm was formed as a power supply layer on the Ti layer by using a sputtering device (SIV-500, manufactured by ULVAC, Inc.). A seed layer configured to include the Ti layer and the Cu layer and the insulating resin layer were annealed by heating at 180° C. for 1 hour.

(5) Formation of a Wiring

A resist film for circuit formation (RY-5107UT, manufactured by Hitachi Chemical Company, Ltd.) coated with a protective film was vacuum-laminated on the seed layer by using a vacuum laminator (V-160, manufactured by Nichigo Morton Co., Ltd.). The laminating temperature was 110° C., the laminating time was 60 seconds, and the laminating pressure was 0.5 MPa. After leaving the above alone for one day, the resist film was exposed by using an i-line stepper exposure machine (product name: S6CK type exposure machine, lens: ASC3 (Ck), manufactured by CERMA PRECISION, INC.). The amount of exposure was 140 mJ/cm$^2$, and the focus was −15 μm. After leaving the above for one day from the exposure, the protective film was peeled off from the resist film, and the resist film was developed by using a spray developer (AD-3000, manufactured by Mikasa Co., Ltd.). The developer was a 1.0% sodium carbonate aqueous solution, the development temperature was 30° C., and the spray pressure was 0.14 MPa. By developing the resist film, a resist having a pattern including an opening where the seed layer was exposed was formed. The resist had a pattern including a portion corresponding to the wiring having an L/S of 10 μm/10 μm, 7 μm/7 μm, 5 μm/5 μm, 3 μm/3 μm, or 2 μm/2 μm.

A structure configured to include the base material, the insulating resin layer, the seed layer, and the resist was immersed, in this order, in an aqueous solution of a cleaner (manufactured by OKUNO Chemical Industries Co., Ltd., product name: ICP Clean S-135) with a concentration of 100 mL/L at 50° C. for 1 minute, in pure water at 50° C. for 1 minute, in pure water at 25° C. for 1 minute, and in a 10% sulfuric acid aqueous solution at 25° C. for 1 minute. On the seed layer after the immersion, a wiring formed of copper plating was formed by electrolytic plating for 10 minutes under the conditions of a current density of 1.5 A/dm$^2$ in a plating bath at 25° C. As a plating bath, an aqueous solution manufactured by adding 0.25 mL of hydrochloric acid, 10 mL of Top Lucina GT-3 (manufactured by OKUNO Chemical Industries Co., Ltd., product name), and 1 mL of Top Lucina GT-2 (manufactured by OKUNO Chemical Industries Co., Ltd., product name) to 7.3 L of an aqueous solution containing copper sulfate pentahydrate with a concentration of 120 g/L and 96% sulfuric acid with a concentration of 220 g/L was used. The structure after forming the wiring was immersed in pure water at 25° C. for 5 minutes, and then dried on a hot plate at 80° C. for 5 minutes.

The resist was peeled off by using a spray developer (AD-3000, manufactured by Mikasa Co., Ltd.). A 2.38% TMAH aqueous solution was used as a stripping solution, the stripping temperature was 40° C., and the spray pressure was 0.2 MPa.

The Cu layer exposed by peeling off the resist was removed by immersing the Cu layer in an etching solution at 25° C. (aqueous solution containing WLC-C2 (MITSUBISHI GAS CHEMICAL COMPANY, INC.) with a concentration of 500 mL/L) for 2 minutes. Then, the structure was immersed in pure water at 25° C. for 5 minutes. Subsequently, the Ti layer was removed by immersing the Ti layer in an etching solution at 30° C. (WLC-C2 concentration: 900 mL/L, 28% ammonia water concentration: 28 mL/L), which is manufactured by mixing WLC-T (manufactured by MITSUBISHI GAS CHEMICAL COMPANY, INC.) and 28% ammonia water, for 1 minute. The structure from which the seed layer had been removed was immersed in pure water at 25° C. for 5 minutes, and then dried on a hot plate at 80° C. for 5 minutes. By the above operation, a wiring structure having an insulating resin layer and a wiring provided on the insulating resin layer was obtained.

Comparative Example 1-1

An insulating resin layer having a pattern including an opening was formed on a base material by the same procedure as in Example 1. The base material and the insulating resin layer were swollen by immersing these in 40 mL/L of Swella (Cleaner Security Gant 902, manufactured by Atotech) at 70° C. for 5 minutes. Then, the base material and the insulating resin layer were immersed in pure water for 1 minute. Subsequently, the surface of the insulating resin layer was roughened by immersing the base material and the insulating resin layer in 40 mL/L of a desmear solution (compact CP, manufactured by Atotech) at 70° C. The immersion time (treatment time) was 5 minutes, 10 minutes, 15 minutes, or 20 minutes. Then, the base material and the insulating resin layer were immersed in pure water at 25° C. for 5 minutes and dried on a hot plate at 80° C. for 5 minutes. Then, in the same procedure as in Example 1, a wiring structure having an insulating resin layer and a wiring provided on the insulating resin layer was obtained.

Comparative Example 1-2

An insulating resin layer having a pattern including an opening was formed on a base material by the same procedure as in Example 1. The surface of the insulating resin layer was treated by oxygen plasma treatment using a plasma device (AP-1000, manufactured by March). The plasma output was 300 W, and the oxygen flow rate was 100 sccm. The oxygen plasma treatment time was 1 minute, 3 minutes, 5 minutes, or 10 minutes. Then, a wiring structure having an insulating resin layer and a wiring provided on the insulating resin layer was obtained.

2. Analysis of a Modified Region 2-1. Surface Roughness

Figure 9:
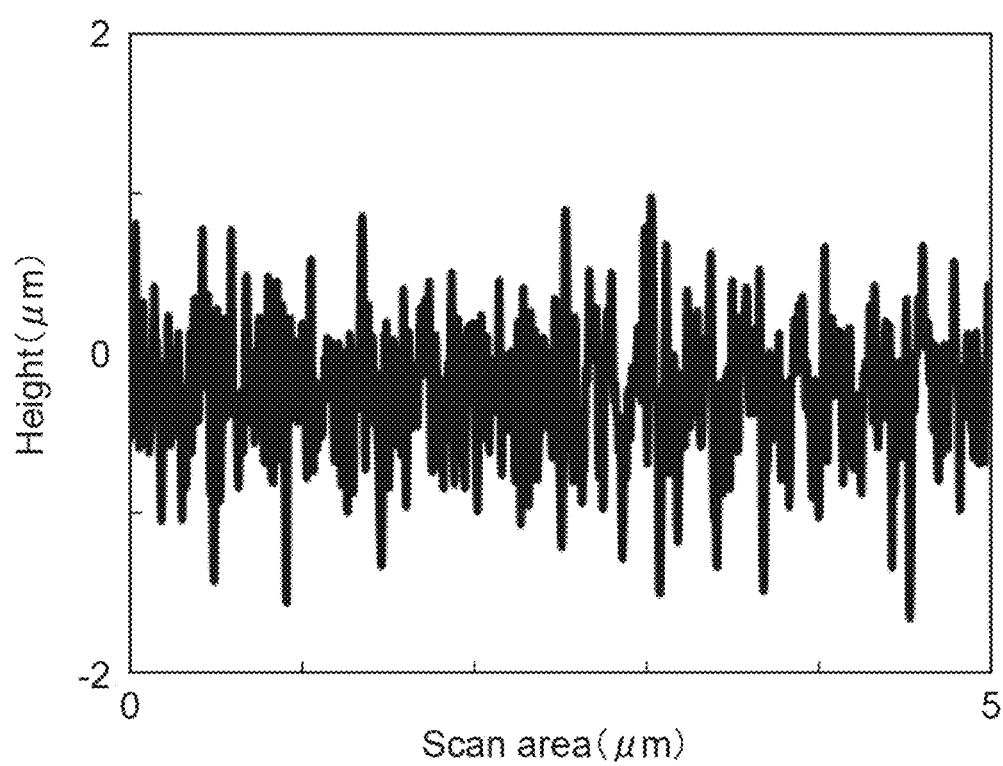
FIG. 9 is a graph showing the unevenness of a surface of an insulating resin layer treated by desmear treatment.

The surface roughness Ra of the insulating resin layer after forming a modified region was measured by using a laser microscope (OLS4000, manufactured by Olympus Corporation). According to the value of Ra, the surface roughness was classified according to the following criteria.
A: 70 nm or less
B: More than 70 nm and 100 nm or less
C: More than 100 nm FIGS. 8, 9, and 10 are graphs showing the measurement results of the surface roughness. FIG. 8 shows the unevenness of the surface of the insulating resin layer after the treatment by Example 1 (ultraviolet emission), where FIG. 8(a) corresponds to the treatment time of 30 seconds and FIG. 8(b) corresponds to the treatment time of 600 seconds. FIG. 9 shows the unevenness of the surface of the insulating resin layer after 10 minutes of treatment by Comparative example 1-1 (desmear treatment). FIG. 10 shows the unevenness of the surface of the insulating resin layer after the treatment by Comparative example 1-2 (oxygen plasma treatment), where FIG. 10(a) corresponds to the treatment time of 3 minutes and FIG. 10(b) corresponds to the treatment time of 5 minutes.

2-2. Depth of a Modified Region

The cross section of the insulating resin layer after surface modification was observed by using a scanning transmission electron microscope (STEM, HD-2700, manufactured by Hitachi, Ltd.). A region where the presence of fine pores formed by surface modification was recognized was regarded as a modified region, and the depth (thickness from the surface of the insulating resin layer) was measured. The depth of the modified region was classified according to the following criteria.
A: 50 nm or more
B: 10 nm or more and less than 50 nm
C: Less than 10 nm 3. Wiring Formability The formation state of the wiring was observed, and the wiring formability was determined according to the following criteria based on the number of wirings in which defects due to peeling from the insulating resin layer were recognized among 10 wirings included in each portion with L/S of 10 μm/10 μm, 7 μm/7 μm, 5 μm/5 μm, 3 μm/3 μm, or 2 μm/2 μM.
A: 0
B: 1 to 2
C: 3 or more Table 1 shows the evaluation results of the surface roughness, the thickness of a modified region, and the wiring formability. In the case of Example 1 in which a modified region was formed while suppressing an increase in surface roughness by ultraviolet emission, it was confirmed that the fine wiring was stably formed without any loss. In Comparative examples 1-1 and 1-2, the surface of the insulating resin layer was roughened, but the formation of a modified region including pores was not substantially observed.

TABLE 1

| | | | 30 sec | 45 sec | 60 sec | 120 sec | 180 sec | 300 sec | 600 sec |
|---|---|---|---|---|---|---|---|---|---|
| Example 1 Ultraviolet rays | Processing time | | | | | | | | |
| | Surface roughness | | A | A | A | A | A | A | A |
| | Modified region depth | | A | A | A | A | A | A | A |
| | Wiring formability L/S (μm/μm) | 10/10 | A | A | A | A | A | A | A |
| | | 7/7 | A | A | A | A | A | A | A |
| | | 5/5 | A | A | A | A | A | A | A |
| | | 3/3 | A | A | A | A | A | A | A |
| | | 2/2 | A | A | A | A | A | A | A |
| Comp. example 1-1 Desmear treatment | Processing time | | 5 min | 10 min | 15 min | 20 min | | | |
| | Surface roughness | | B | C | C | C | | | |
| | Modified region depth | | C | C | C | C | | | |
| | Wiring formability L/S (μm/μm) | 10/10 | B | B | A | A | | | |
| | | 7/7 | B | B | A | A | | | |
| | | 5/5 | C | A | A | C | | | |
| | | 3/3 | C | B | B | C | | | |
| | | 2/2 | C | B | C | C | | | |
| Comp. example 1-2 Oxygen plasma treatment | Processing time | | 1 min | 3 min | 5 min | 10 min | | | |
| | Surface roughness | | A | B | C | C | | | |
| | Modified region depth | | C | C | C | C | | | |
| | Wiring formability L/S (μm/μm) | 10/10 | C | A | A | A | | | |
| | | 7/7 | B | B | A | A | | | |
| | | 5/5 | B | A | A | C | | | |
| | | 3/3 | C | B | B | C | | | |
| | | 2/2 | C | C | C | C | | | |

Examination II

1. Manufacture of a Wiring Structure

Example 2

(1) Formation of a First Layer of Insulating Resin Layer

The following materials were mixed to prepare a solution containing a photosensitive resin composition for forming an insulating resin layer.

Photoreactive Resin:

Acid-modified cresol novolac type epoxy acrylate having a carboxyl group and an ethylenically unsaturated group (CCR-1219H, manufactured by Nippon Kayaku Co., Ltd., product name)

Photoinitiator:

2,4,6-trimethylbenzoyl-diphenyl-phosphinoxide (Darocure TPO, manufactured by Ciba Japan K.K., product name), and ethanone, 1-[9-ethyl-6-(2-methylbenzoyl)-9H- carbazol-3-yl]-, 1-(o-acetyloxime) (Irgacure OXE-02, manufactured by Ciba Japan K.K., product name)
Thermosetting Component:
Biphenol type epoxy resin (YX-4000, manufactured by Japan Epoxy Resin Co., Ltd., product name)
Filler:
Silica filler surface-treated with vinylsilane (average particle size 50 nm)

The dispersion state of the silica filler in the solution was measured by using the dynamic light scattering nanotrack particle size distribution meter "UPA-EX150" (manufactured by NIKKISO CO., LTD.) and the laser diffraction scattering type microtrack particle size distribution meter "MT-3100" (manufactured by NIKKISO CO., LTD.). It was confirmed that the silica filler was dispersed so that the maximum particle size was 1 μm or less.

The solution of the photosensitive resin composition was uniformly applied onto a 16 μm-thick polyethylene terephthalate film (G2-16, manufactured by TEIJIN LIMITED, product name). The coating film was dried by heating at 100° C. for about 10 minutes to form a photosensitive resin layer having a film thickness of 15 μm.

A base material (200 mm×200 mm square, thickness 1.5 mm) having an insulating substrate including a glass cloth and a copper layer (thickness 20 μm) provided on the surface of the insulating substrate was prepared. A photosensitive resin layer was placed on the surface of the copper layer of the base material, and the whole was pressed by using a press-type vacuum laminator (MVLP-500, manufactured by Meiki Co., Ltd.). The photosensitive resin layer was stacked on the base material by pressing. The pressing conditions were a press hot plate temperature of 80° C., a vacuum drawing time of 20 seconds, a laminating press time of 60 seconds, an atmospheric pressure of 4 kPa or less, and a crimping pressure of 0.4 MPa.

(2) Formation of a First Layer of Insulating Resin Layer Having an Opening

A photo tool having a pattern including an opening was brought into close contact with the photosensitive resin layer on the base material. Then, the photosensitive resin layer was exposed with the amount of energy of 30 mJ/cm$^2$ by using an i-line stepper exposure machine (product name: S6CK type exposure machine, lens: ASC3 (Ck), manufactured by CERMA PRECISION, INC.). A first layer of an insulating resin layer having a pattern including an opening where the surface of the base material was exposed was formed by spray development for 45 seconds using a 1% by mass sodium carbonate aqueous solution at 30° C. The developed insulating resin layer was post-UV exposed with the amount of energy of 2000 mJ/cm$^2$ by using a mask exposure machine (EXM-1201 type exposure machine, manufactured by ORC MANUFACTURING CO., LTD.). Then, the insulating resin layer was heat-cured by heating at 170° C. for 1 hour in a clean oven.

(3) Formation of a Modified Region

The entire surface of the heat-cured insulating resin layer was irradiated with ultraviolet rays by using an ultraviolet emission device (SSP-16, manufactured by SEN LIGHTS Corporation) having an ultraviolet lamp. The distance from the ultraviolet lamp to the surface of the insulating resin layer was 40 mm, and the treatment time by ultraviolet emission was 45 seconds. By ultraviolet emission, a modified region including fine pores was formed in the surface layer of the insulating resin layer.

(4) Formation of a Seed Layer

A Ti layer having a thickness of 150 nm was formed as an adhesion layer on the surface of the insulating resin layer including the modified region by using a sputtering device (SIV-500, manufactured by ULVAC, Inc.). A Cu layer having a thickness of 200 nm was formed as a power supply layer on the Ti layer by using a sputtering device (SIV-500, manufactured by ULVAC, Inc.). A seed layer configured to include the Ti layer and the Cu layer and the insulating resin layer were annealed by heating at 180° C. for 1 hour.

(5) Formation of a Wiring

A resist film for circuit formation (RY-5107UT, manufactured by Hitachi Chemical Company, Ltd.) coated with a protective film was vacuum-laminated on the seed layer by using a vacuum laminator (V-160, manufactured by Nichigo Morton Co., Ltd.). The laminating temperature was 110° C., the laminating time was 60 seconds, and the laminating pressure was 0.5 MPa. After leaving the above alone for one day, the resist film was exposed by using an i-line stepper exposure machine (product name: S6CK type exposure machine, lens: ASC3 (Ck), manufactured by CERMA PRECISION, INC.). The amount of exposure was 140 mJ/cm$^2$, and the focus was −15 μm. After leaving the above for one day from the exposure, the protective film was peeled off from the resist film, and the resist film was developed by using a spray developer (AD-3000, manufactured by Mikasa Co., Ltd.). The developer was a 1.0% sodium carbonate aqueous solution, the development temperature was 30° C., and the spray pressure was 0.14 MPa. By developing the resist film, a resist having a pattern including an opening which corresponded to the wiring and the connecting part and where the seed layer was exposed was formed.

A structure configured to include the base material, the insulating resin layer, the seed layer, and the resist was immersed, in this order, in an aqueous solution of a cleaner (manufactured by OKUNO Chemical Industries Co., Ltd., product name: ICP Clean S-135) with a concentration of 100 mL/L at 50° C. for 1 minute, in pure water at 50° C. for 1 minute, in pure water at 25° C. for 1 minute, and in a 10% sulfuric acid aqueous solution at 25° C. for 1 minute. On the seed layer after the immersion, a wiring and a connecting part formed of copper plating was formed by electrolytic plating for 10 minutes under the conditions of a current density of 1.5 A/dm$^2$ in a plating bath at 25° C. As a plating bath, an aqueous solution manufactured by adding 0.25 mL of hydrochloric acid, 10 mL of Top Lucina GT-3 (manufactured by OKUNO Chemical Industries Co., Ltd., product name), and 1 mL of Top Lucina GT-2 (manufactured by OKUNO Chemical Industries Co., Ltd., product name) to 7.3 L of an aqueous solution containing copper sulfate pentahydrate with a concentration of 120 g/L and 96% sulfuric acid with a concentration of 220 g/L was used. The structure after forming the wiring was immersed in pure water at 25° C. for 5 minutes, and then dried on a hot plate at 80° C. for 5 minutes.

The resist was peeled off by using a spray developer (AD-3000, manufactured by Mikasa Co., Ltd.). A 2.38% TMAH aqueous solution was used as a stripping solution, the stripping temperature was 40° C., and the spray pressure was 0.2 MPa.

The Cu layer exposed by peeling off the resist was removed by immersing the Cu layer in an etching solution at 25° C. (aqueous solution containing WLC-C2 (MITSUBISHI GAS CHEMICAL COMPANY, INC.) with a concentration of 500 mL/L) for 2 minutes. Then, the structure was immersed in pure water at 25° C. for 5 minutes. Subsequently, the Ti layer was removed by immersing the Ti layer in an etching solution at 30° C. (WLC-C2 concentration: 900 mL/L, 28% ammonia water concentration: 28 mL/L), which is manufactured by mixing WLC-T (manufactured by MIT- SUBISHI GAS CHEMICAL COMPANY, INC.) and 28% ammonia water, for 1 minute. The structure from which the seed layer had been removed was immersed in pure water at 25° C. for 5 minutes, and then dried on a hot plate at 80° C. for 5 minutes.

(6) Formation of a Surface Treatment Agent Layer

The wiring and the connecting part formed by copper plating were spray-washed with a 5% hydrochloric acid aqueous solution at 25° C. for 30 seconds at a water pressure of 0.2 MPa. Then, the wiring and the connecting part were washed with pure water at 25° C. for 1 minute. After washing, the wiring and the connecting part were spray-treated with a surface treatment agent (CZ-8401, MEC COMPANY LTD.) at 25° C. for 1 minute at a water pressure of 0.2 MPa. Then, the wiring and the connecting part were sequentially treated so as to be washed with running pure water at 25° C. for 1 minute, spray-treated at 25° C. for 20 seconds with a 10% sulfuric acid aqueous solution, and washed with running pure water at 25° C. for 1 minute. Then, the structure was dried on a hot plate at 100° C. for 5 minutes. As a result, a surface treatment agent layer that covered exposed portions of the wiring and the connecting part was formed.

(7) Formation of a Modified Region

The entire surfaces of the insulating resin layer and the surface treatment agent layer were irradiated with ultraviolet rays by using an ultraviolet emission device (SSP-16, manufactured by SEN LIGHTS Corporation) having an ultraviolet lamp. The distance from the ultraviolet lamp to the surface of the insulating resin layer was 40 mm, and the treatment time by ultraviolet emission was 30 seconds, 45 seconds, 60 seconds, 90 seconds, 120 seconds, 180 seconds, 300 seconds, or 600 seconds. By ultraviolet emission, a modified region including fine pores was formed in the surface layers of the insulating resin layer and the surface treatment agent layer.

(8) Formation of a Second Layer of an Insulating Resin Layer

A second layer of an insulating resin layer where the surface treatment agent layer on the connecting part was exposed was formed on the first layer of the insulating resin layer by using the same photosensitive resin composition as the photosensitive resin composition used to form the first layer of the insulating resin layer.

(9) Removal of a Surface Treatment Agent Layer

In order to remove the surface treatment agent layer exposed in the opening, first, the surface treatment agent layer was subjected to oxygen plasma treatment for 5 minutes under the conditions of an oxygen flow rate of 1000 sccm and an output of 500 W by using a plasma asher (AP-1000, manufactured by March). Then, the surface treatment agent layer was copper-etched with a 10 g/L ammonium persulfate aqueous solution for 2 minutes, and then washed with running pure water at 25° C. for 1 minute. Then, the exposed connecting part was dried on a hot plate at 100° C. for 5 minutes. By the above operation, a wiring structure for evaluation having two insulating resin layers, a wiring, and a connecting part was obtained.

Comparative Example 2-1

A first layer of the insulating resin layer having a pattern including an opening was formed on a base material by the same procedure as in Example 2. The insulating resin layer was swollen by immersing the base material and the insulating resin layer in 40 mL/L of Swella (Cleaner Security Gant 902, manufactured by Atotech) at 70° C. for 5 minutes. Then, the base material and the insulating resin layer were immersed in pure water for 1 minute. Subsequently, the surface of the insulating resin layer was roughened by immersing the base material and the insulating resin layer in 40 mL/L of a desmear solution (compact CP, manufactured by Atotech) at 70° C. The immersion time (treatment time) was 5 minutes, 10 minutes, 15 minutes, or 20 minutes. Then, the base material and the insulating resin layer were immersed in pure water at 25° C. for 5 minutes and dried on a hot plate at 80° C. for 5 minutes. Then, the seed layer, the wiring, and the surface treatment agent layer were formed in the same manner as in Example 2.

The first layer of the insulating resin layer was swollen by immersing the structure in which the surface treatment agent layer was formed in 40 mL/L of Swella (Cleaner Security Gant 902, manufactured by Atotech) at 70° C. for 5 minutes. Then, the structure was immersed in pure water for 1 minute. Subsequently, the surface of the first layer of the insulating resin layer was roughened by immersing the structure in 40 mL/L of a desmear solution (compact CP, manufactured by Atotech) at 70° C. The immersion time was 5 minutes, 10 minutes, 15 minutes, and 20 minutes, as in the case of the first treatment using the desmear solution. Then, the structure was immersed in pure water for 1 minute and dried on a hot plate at 80° C. for 5 minutes. A structure having an immersion time of 0 minute, that is, a structure not subjected to roughening treatment using a desmear solution was also prepared, and this was also used in the next step for the second layer of the insulating resin layer.

Then, a second layer of the insulating resin layer where the surface treatment agent layer on the connecting part was exposed was formed on the first layer of the insulating resin layer by using the same photosensitive resin composition as the photosensitive resin composition used to form the first layer of the insulating resin layer. The surface treatment material layer exposed in the opening was removed in the same manner as in Example 2. By the above operation, a wiring structure for evaluation having two insulating resin layers, a wiring, and a connecting part was obtained.

2. Evaluation

The cross section of the manufactured wiring structure was observed by using a scanning electron microscope (Regulus-8230, manufactured by Hitachi High-Technologies Corporation), and the presence or absence of peeling between the first layer of the insulating resin layer and the second layer of the insulating resin layer and the presence or absence of the surface treatment agent layer were checked. As shown in Table 2, in the wiring structure of Example 2, the surface treatment agent layer for improving the adhesion of the wiring was maintained, and peeling between the insulating resin layers was not observed. In the structure of Example 2 in which the surface treatment agent layer was maintained, no peeling between the wiring and the insulating resin layer was observed. As shown in Table 3, in the case of Comparative example 2-1 using the desmear treatment, the surface treatment agent layer for improving the adhesion of the wiring disappeared.

TABLE 2

| | Ultraviolet emission time (second) | Peeling | Surface treatment agent layer | Determination |
|---|---|---|---|---|
| Example 2 | 30 | None | Yes | OK |
| | 45 | None | Yes | OK |

TABLE 2-continued

| Ultraviolet emission time (second) | Peeling | Surface treatment agent layer | Determination |
|---|---|---|---|
| 60 | None | Yes | OK |
| 90 | None | Yes | OK |
| 120 | None | Yes | OK |
| 180 | None | Yes | OK |
| 300 | None | Yes | OK |
| 600 | None | Yes | OK |

TABLE 3

| | Desmear solution immersion time (minute) | Peeling | Surface treatment agent layer | Determination |
|---|---|---|---|---|
| Comparative example 2-1 | 0 | Yes | Yes | NG |
| | 5 | None | None | NG |
| | 10 | None | None | NG |
| | 15 | None | None | NG |
| | 20 | None | None | NG |

REFERENCE SIGNS LIST

1: base material, 3: seed layer, 4: resist, 5: wiring (copper wiring), 5a: connecting part, 6: surface treatment agent layer, 7: multilayer wiring part, 8: semiconductor chip, 11: insulating substrate, 12: conductive layer, 20, 22a, 40, 40a: opening, 21, 22, 23: insulating resin layer, 21A, 21B: modified region, 21S: surface of insulating resin layer, 31: adhesion layer, 32: power supply layer, 60: wiring structure, 100: semiconductor package.

The invention claimed is:

1. A wiring structure, comprising: an insulating resin layer; a seed layer provided on the insulating resin layer and including one or more metal layers; and a copper wiring provided on the seed layer, wherein a modified region including pores is formed in a surface layer of the insulating resin layer on the seed layer side, and a part of metal forming the seed layer penetrates into the pores, and wherein the surface of the insulating resin layer including the modified region has a surface roughness Ra of 70 nm or less.

2. The wiring structure according to claim 1, wherein the seed layer includes: an adhesion layer in contact with the insulating resin layer; and a power supply layer formed on the adhesion layer, the adhesion layer is a metal layer containing titanium, chromium, tungsten, nickel, or a combination thereof, and the power supply layer is a metal layer containing copper.

3. The wiring structure according to claim 1, wherein a depth of the modified region is 50 nm or more.

4. The wiring structure according to claim 1, wherein the wiring includes a linear portion having a width of 1 to 10 μm.

5. A semiconductor package, comprising: the wiring structure according to claim 1; and a semiconductor chip connected to the wiring of the wiring structure.

6. A wiring structure, comprising: an insulating resin layer; a seed layer provided on the insulating resin layer and including one or more metal layers; and a copper wiring provided on the seed layer, wherein a modified region including pores is formed in a surface layer of the insulating resin layer on the seed layer side, and a part of metal forming the seed layer penetrates into the pores, and wherein a depth of the modified region is 50 nm or more and 200 nm or less.

7. The wiring structure according to claim 6, wherein the seed layer includes: an adhesion layer in contact with the insulating resin layer; and a power supply layer formed on the adhesion layer, the adhesion layer is a metal layer containing titanium, chromium, tungsten, nickel, or a combination thereof, and the power supply layer is a metal layer containing copper.

8. The wiring structure according to claim 6, wherein the wiring includes a linear portion having a width of 1 to 10 μm.

9. A semiconductor package, comprising: the wiring structure according to claim 6; and a semiconductor chip connected to the wiring of the wiring structure.

* * * * *